US008293658B2

(12) United States Patent
Shero et al.

(10) Patent No.: US 8,293,658 B2
(45) Date of Patent: Oct. 23, 2012

(54) REACTIVE SITE DEACTIVATION AGAINST VAPOR DEPOSITION

(75) Inventors: Eric Shero, Phoenix, AZ (US); Mohith Verghese, Phoenix, AZ (US); Anthony Muscat, Tucson, AZ (US); Shawn Miller, Tucson, AZ (US)

(73) Assignee: ASM America, Inc., Phoenix, AZ (US)

( * ) Notice: Subject to any disclaimer, the term of this patent is extended or adjusted under 35 U.S.C. 154(b) by 442 days.

(21) Appl. No.: 12/707,065

(22) Filed: Feb. 17, 2010

(65) Prior Publication Data

US 2011/0198736 A1 Aug. 18, 2011

(51) Int. Cl.
*H01L 21/31* (2006.01)

(52) U.S. Cl. ........ 438/763; 438/758; 438/765; 438/780; 438/781; 257/629; 257/632; 257/642; 257/E21.174

(58) Field of Classification Search ........................ None
See application file for complete search history.

(56) References Cited

U.S. PATENT DOCUMENTS

| | | | |
|---|---|---|---|
| 4,539,061 | A | 9/1985 | Sagiv |
| 4,756,971 | A | 7/1988 | Virtanen et al. |
| 5,350,480 | A | 9/1994 | Gray |
| 5,479,727 | A | 1/1996 | Fine et al. |
| 5,591,494 | A | 1/1997 | Sato et al. |
| 5,647,953 | A | 7/1997 | Williams et al. |
| 5,728,629 | A | 3/1998 | Mizuno et al. |
| 6,071,573 | A | 6/2000 | Koemtzopoulos et al. |
| 6,162,499 | A | 12/2000 | Sandhu et al. |
| 6,316,052 | B1 | 11/2001 | Shiokawa |
| 6,365,420 | B2 | 4/2002 | Ashida |
| 6,391,785 | B1 | 5/2002 | Satta et al. |
| 6,416,577 | B1 | 7/2002 | Suntoloa et al. |
| 6,468,903 | B2 | 10/2002 | Bolscher et al. |
| 6,537,461 | B1 | 3/2003 | Nakahara et al. |
| 6,562,140 | B1 | 5/2003 | Bondestam et al. |
| 6,664,192 | B2 | 12/2003 | Satta et al. |
| 6,720,259 | B2 | 4/2004 | Londergan et al. |
| 6,767,582 | B1 | 7/2004 | Elers |

(Continued)

FOREIGN PATENT DOCUMENTS

EP 0 844 028 5/1998

(Continued)

OTHER PUBLICATIONS

Schmohl et al., "Functionalization of oxidized silicon surfaces with methyl groups and their characterization," Superlattices and Microstructures, Sep. 15, 2004, Superlattices and Microstructures 36 (2004), pp. 113-121, Elsevier Ltd.

(Continued)

*Primary Examiner* — Kyoung Lee
(74) *Attorney, Agent, or Firm* — Knobbe, Martens, Olson & Bear LLP

(57) ABSTRACT

Methods and structures relating to the formation of mixed SAMs for preventing undesirable growth or nucleation on exposed surfaces inside a reactor are described. A mixed SAM can be formed on surfaces for which nucleation is not desired by introducing a first SAM precursor having molecules of a first length and a second SAM precursor having molecules of a second length shorter than the first. Examples of exposed surfaces for which a mixed SAM can be provided over include reactor surfaces and select surfaces of integrated circuit structures, such as insulator and dielectric layers.

40 Claims, 13 Drawing Sheets

U.S. PATENT DOCUMENTS

| | | | | |
|---|---|---|---|---|
| 6,890,596 | B2 | 5/2005 | Sarigiannis et al. | |
| 7,045,170 | B1 | 5/2006 | Hankins et al. | |
| 7,118,779 | B2 | 10/2006 | Verghese et al. | |
| 7,799,135 | B2 | 9/2010 | Verghese et al. | |
| 7,914,847 | B2 | 3/2011 | Verghese et al. | |
| 2002/0018849 | A1 | 2/2002 | George et al. | |
| 2002/0022265 | A1 | 2/2002 | Bailey et al. | |
| 2004/0023516 | A1 | 2/2004 | Londergan et al. | |
| 2004/0033639 | A1* | 2/2004 | Chinn et al. | 438/59 |
| 2004/0134427 | A1 | 7/2004 | Derderian et al. | |
| 2005/0012975 | A1 | 1/2005 | George | |
| 2005/0037135 | A1 | 2/2005 | Zhu | |
| 2006/0040054 | A1 | 2/2006 | Pearlstein et al. | |
| 2006/0108320 | A1 | 5/2006 | Lazovsky | |
| 2007/0098894 | A1 | 5/2007 | Verghese et al. | |
| 2008/0081151 | A1 | 4/2008 | Kobrin et al. | |
| 2008/0105979 | A1 | 5/2008 | Whelan | |
| 2008/0113178 | A1 | 5/2008 | Lazovsky | |

FOREIGN PATENT DOCUMENTS

| | | |
|---|---|---|
| JP | 2001-20075 | 1/2001 |
| JP | 2003-511560 | 3/2003 |
| WO | WO 01/27346 | 4/2001 |
| WO | WO 01/40541 | 6/2001 |
| WO | WO 02/088421 | 11/2002 |
| WO | WO 2004/063421 | 7/2004 |

OTHER PUBLICATIONS

Chen et al., "Surface Modification for Area-selective Atomic Layer Deposition," NSF/SRC Engineering Research Center for Environmentally Benign Semiconductor Manufacturing, pp. 1-33 (2003).

Herrmann et al., "Conformal Hydrophobic Coatings Prepared Using Atomic Layer Deposition Seed Layers and Non-Chlorinated Hydrophobic Precursors", Journal of Micromechanics and Microengineering, vol. 15, 2005, pp. 1-9.

Mui et al., "Surface Modification for Selective Atomic Layer Deposition of High-κ Dielectric Materials," NSF/SRC Engineering Research Center for Environmentally Benign Semiconductor Manufacturing, pp. 1-21 (2002).

International Search Report for application No. PCT/US2011/024762 mailed Dec. 22, 2011.

* cited by examiner

REACTIVE SITE DEACTIVATION AGAINST VAPOR DEPOSITION

BACKGROUND

1. Field of the Invention

This application relates generally to inhibiting vapor deposition on selected surfaces, such as reactor surfaces or select surfaces on a substrate.

2. Description of the Related Art

Atomic layer deposition (ALD) is a known process in the semiconductor industry for forming thin films of materials on substrates, such as silicon wafers. ALD is a type of vapor deposition wherein a film is built up through self-saturating surface reactions performed in cycles. In an ALD process, gaseous precursors are supplied, alternatingly and repeatedly, to the substrate to form a thin film of material on the substrate. One reactant adsorbs in a self-limiting process on the wafer. A subsequent reactant pulse reacts with the adsorbed material to form a molecular layer of the desired material. The subsequent pulse can reduce or getter ligands from the adsorbed layer, can replace such ligands or otherwise add atoms (e.g., oxidize, nitridize, etc.). In a typical ALD reaction, no more than a molecular monolayer forms per cycle. Cycles can be more complex and involve three or more reactants in sequence. Some recognized advantages of ALD are low temperature processing and near perfect conformality, leading to great interest in ALD for semiconductor processing.

Other processes besides ALD exist for forming thin films of materials on substrates. One such process is chemical vapor deposition (CVD), in which a substrate is exposed to one or more volatile precursors which react and/or decompose on the substrate to form a thin film. Both ALD and CVD can be sensitive to the exposed surface; depending upon the precursors and deposition conditions, vapor deposition processes can nucleate well or poorly on different surfaces.

Invariably, during processing, deposition occurs on exposed surfaces other than those for which deposition may be desired. For example, a film buildup can occur on exposed surfaces of a reactor as multiple substrates are processed in sequence. The film buildup can delaminate or flake from the reactor surfaces and contaminate the substrate surface. Large amounts of loosely adhered film buildup on the reactor surfaces also increases the total surface area exposed to a reactant pulse, thereby increasing the pulse and purge time required to saturate substrate surfaces. In addition, films can be deposited on undesirable areas of semiconductor device structures, such as dielectric surfaces, entailing additional patterning and etch steps.

Currently, selective processes are available that prevent or reduce the amount of unwanted film deposition on reactor surfaces and device structures. One such process utilizes a treatment process that results in a protective self-assembled monolayer (SAM) over reactor surfaces and is described in U.S. Patent Application No. 2007/0098894, filed on Nov. 30, 2006. Another such process utilizes a treatment process that results in a selective deposition on substrate surfaces and is described in U.S. Pat. No. 6,391,785, filed on Aug. 23, 2000.

Improved processes for preventing or minimizing film buildup caused by deposition processes on reactor surfaces and select surfaces of device structures are thus desired.

SUMMARY

Methods and devices are provided that use a mixed self-assembled monolayer over surfaces on which film deposition is not desired. In some aspects, a method comprises providing an exposed surface. A first organic precursor having a first chain length is supplied to and adsorbs a self-assembled monolayer over the exposed surface. A second organic precursor having a second molecular chain length shorter than the first molecular chain length is supplied. The second organic precursor adsorbed onto reactive sites of the exposed surfaces on which the self-assembled monolayer was not adsorbed.

In other aspects, a method of processing with a vapor deposition reactor is provided. The method comprises supplying a first organic precursor to deposit a self-assembled monolayer over portions of a reactor surface and supplying a second organic precursor to react with portions of the reactor surface on which the self-assembled monolayer was not deposited. The second organic precursor includes a chain of molecules that is shorter than the chain of molecules of the first organic precursor.

In other aspects, a method of forming a semiconductor device is provided. The method comprises providing an integrated circuit structure into a reaction chamber. The integrated circuit structure has a first surface and a second surface different from the first surface. A first organic precursor is introduced into the reaction chamber to coat portions of the first surface with a self-assembled monolayer without coating the second surface. Any unreacted first organic precursor can be purged from the reaction chamber. A second organic precursor is introduced into the reaction chamber to react with reactive sites of the first surface that are not coated with the first organic precursor. Any unreacted second organic precursor can be purged from the reaction chamber.

In other aspects, an integrated film structure is provided. The integrated film structure comprises a first surface and an adjacent second surface different from the first exposed surface and a mixed hydrophobic film adsorbed on the first surface without forming on the second surface, the film comprising a plurality of first chain organic molecules interspersed with a plurality of second chain organic molecules, the second chain organic molecules being shorter than the first chain organic molecules.

DETAILED DESCRIPTION OF THE EMBODIMENTS

As noted in the Background section, processes exist to deactivate particular surfaces (e.g., reactor surfaces and surfaces of partially fabricated integrated circuit structures) against vapor deposition such as ALD to allow selective deposition on untreated surfaces. One such process involves forming a densely-packed, self-assembled monolayer (SAM) over exposed surfaces on which film deposition is not desired. A SAM is a relatively ordered assembly of molecules that spontaneously adsorb (also called chemisorb) from either vapor or liquid phase precursors on a surface. A typical SAM molecule includes a terminal functional group, a hydro-carbon chain and a head group. By forming a SAM over selected surfaces, the SAM can prevent film growth over the exposed surfaces using certain types of vapor precursors by blocking reactive sites on the exposed surface that would otherwise react with those deposition precursors. Such selective deactivation can be particularly effective against adsorption-driven processes, like ALD, but can also discourage certain types of CVD.

Figure 1B:
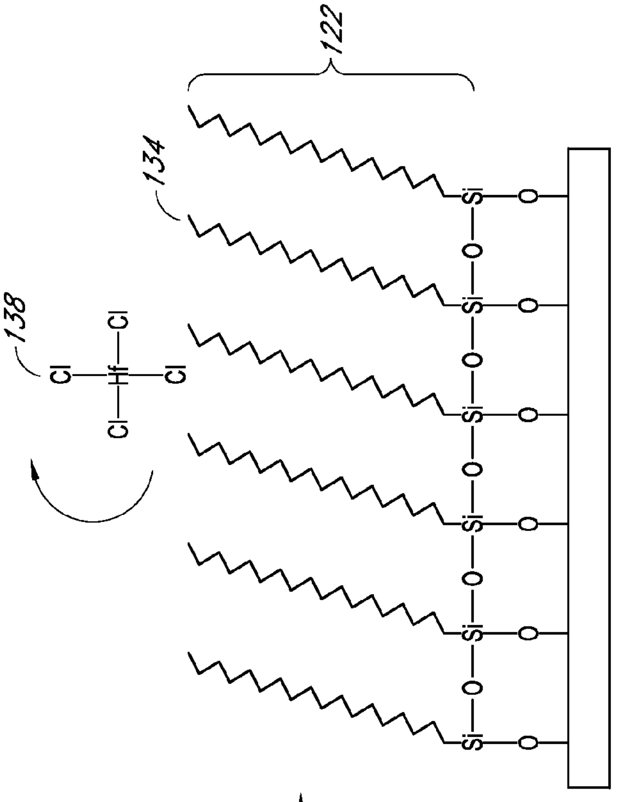
FIGS. 1A and 1B illustrate a layer having an overlying ideal, densely-packed self-assembled monolayer (SAM) exposed to an ALD precursor.
Figure 1A:
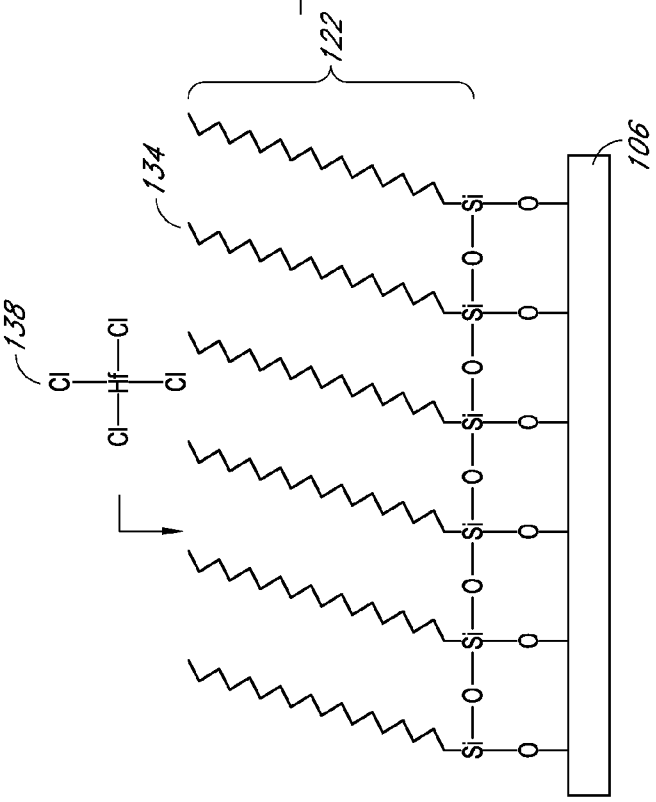

FIGS. 1A and 1B illustrate a surface 106 having an overlying ideal, densely-packed SAM 122 subjected to an ALD precursor 138. The formed SAM 122 is generally "pure," that is, it is composed of molecules from a single molecular agent such as octadecyltrichlorosilane (ODTS). The monomers that form the SAM can be delivered in liquid or vapor form. As shown in FIG. 1A, the SAM molecules 134 are theoretically densely-packed such that they occupy all of the reactive sites over the surface 106. During an ALD process, ALD precursors, such as $HfCl_4$, $ZrCl_4$, $TiCl_4$ or trimethyl aluminum (TMA) can be introduced into a reactor. These precursors will tend to react with exposed surfaces in the reactor, including reactor walls and exposed substrate surfaces. However, for those surfaces 106 having an overlying, densely-packed SAM 122, when the ALD precursors approach, as shown in FIG. 1A, the SAM 122 can prevent the underlying surface 106 from reacting with the ALD precursors by blocking the reactive sites of the underlying surface 106, as shown in FIG. 1B. By using the SAM 122 to block reactive sites, it is possible to deposit films on certain exposed surfaces while preventing or minimizing film deposition on other surfaces covered by the deactivated SAM, such that the deposition process is selective. In one example, insulators on a substrate can be blocked while deposition takes place on adjacent conductor surfaces of the same substrate. In another example, reactor walls can be blocked while deposition takes place on an untreated substrate in the reactor.

Large organic molecules can form self-assembled monolayers (SAMs) on the reactor surface that are very stable and do not easily desorb from the surface. In addition, large organic tails provide a desirable steric hindrance effect and do not allow the ALD reactant to reach the reactor surface.

Unfortunately, molecules of pure blocking SAMs composed of a single molecular agent rarely occupy every reactive site on the surface 106, such that the surfaces 106 underlying the SAM often have exposed reactive sites e.g., —OH termination sites (shown in FIG. 2A), that can undesirably react with deposition precursors. While not bound by theory, it is possible that steric hindrance can have this side effect: SAM molecules adsorbed on reactive sites can themselves interact with each other such that, rather than forming perfectly oriented, densely-packed molecules, the adsorbed SAM molecules cannot orient properly and thus they themselves preclude other SAM molecules from adsorbing with available reactive sites. Thus, even after days of exposure to vapor or liquid phase SAM chemistries, reactive sites of underlying surfaces remain unoccupied and can act as nucleation sites for growth during subsequent deposition, particularly for smaller deposition precursors that are not blocked by steric hindrance in the imperfect SAM.

Figure 2B:
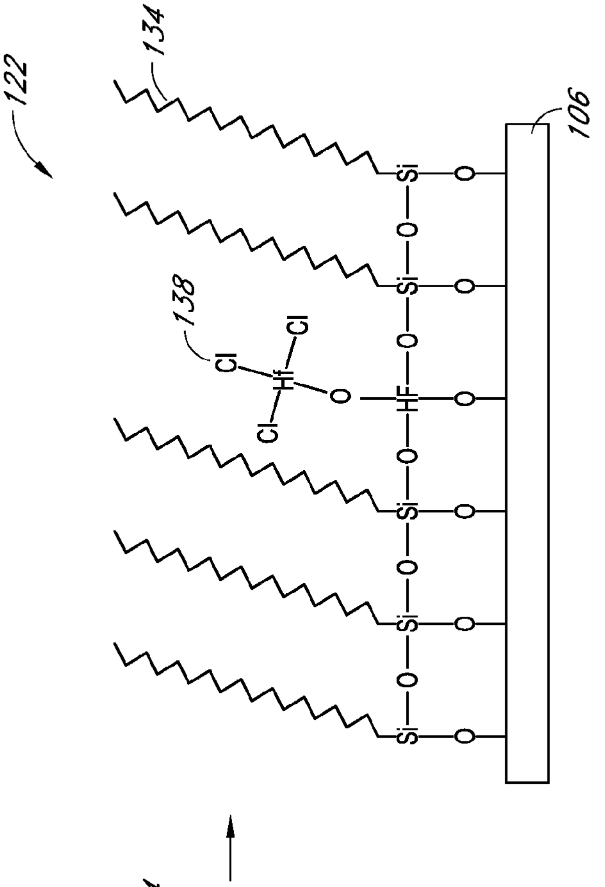
FIGS. 2A and 2B illustrate a layer having an overlying self-assembled monolayer with some unoccupied reactive sites exposed to an ALD precursor.
Figure 2A:
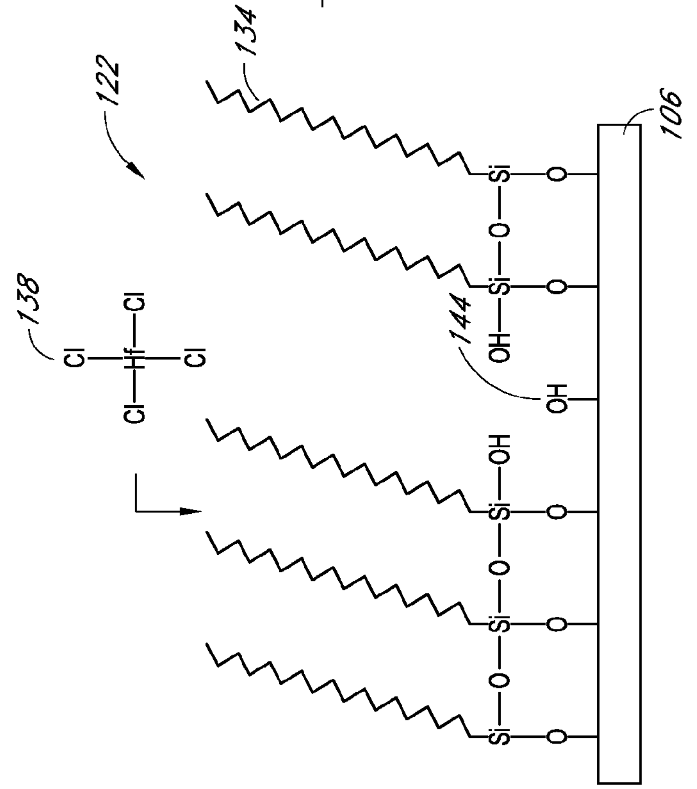

FIGS. 2A and 2B illustrate a surface 106 having a self-assembled monolayer 122 subjected to an ALD precursor 138. As shown in FIG. 2A, even after depositing the SAM 122 over the surface 106, the surface 106 has exposed native oxide hydroxyl groups that serve as reactive sites 144 accessible to ALD precursors 138 during deposition. As shown in FIG. 2B, when ALD precursors 138, such as $HfCl_4$, are introduced during a deposition process, the ALD precursors 138 can react with the exposed reactive sites 144, causing undesirable growth or nucleation.

To solve the above problems, it has been found that rather than forming a "pure" SAM composed of molecules from a uniform molecular agent to block reactive sites on the surface to be deactivated, it is better to have a "mixed" SAM composed of at least two different molecular agents, such as one having long-chain molecules and another having short-chain molecules. Using a mixed SAM can result in a greater reduction of available reactive sites that would otherwise react with deposition precursors. In a particular application for deactivating reactor walls or other parts, when the mixed SAM is formed on reactor surfaces, this has the effect of slowing nucleation and thus, reducing reactor contamination caused by delamination or flaking of film buildup and reducing the frequency of in situ or ex situ cleaning steps on the reactor surfaces. Moreover, wafer throughput can be increased, as a greater number of runs can be conducted between cleaning steps to remove built-up deposition on reactor walls. Advantageously, when the mixed SAM is formed on selected surfaces (e.g., reactor walls or insulators on a partially fabricated integrated circuit), this has the effect of increasing deposition selectivity over a longer ALD reaction time, in which material is deposited on untreated surfaces while minimally (if at all) on other surfaces.

Methods and structures relating to the formation of mixed SAMs for preventing undesirable growth or nucleation on selected surfaces are described. In some embodiments, a mixed SAM is formed over an underlying surface to protect the underlying surface against undesirable growth or nucleation. The mixed SAM comprises first organic chain molecules and second organic chain molecules that are shorter than the first. The first chain molecules can be first adsorbed onto reactive sites, e.g., M-OH or —OH termination sites, of the underlying surface, forming a SAM to protect against undesirable growth or nucleation. Once the first chain molecules are adsorbed, the second chain molecules can diffuse among the first chain molecules, and adsorb onto and quench any unoccupied reactive sites of the underlying surface on which the first chain molecules were not adsorbed, thereby further reducing or eliminating the number of reactive sites on the underlying surface accessible to deposition precursors. Together, the first chain molecules and second chain molecules form a mixed SAM that blocks deposition precursors from reacting with the underlying surface.

In some embodiments, the first-chain molecules of the mixed SAM comprise long-chain molecules, while the second-chain molecules of the mixed SAM comprise short-chain molecules. For purposes of this application, the term "long-chain molecules" includes molecules having greater than or equal to eight carbon atoms, while the term "short-term molecules" includes molecules having less than eight carbon atoms. The SAM precursors or molecules can be linear or branched chains.

Figure 3A:
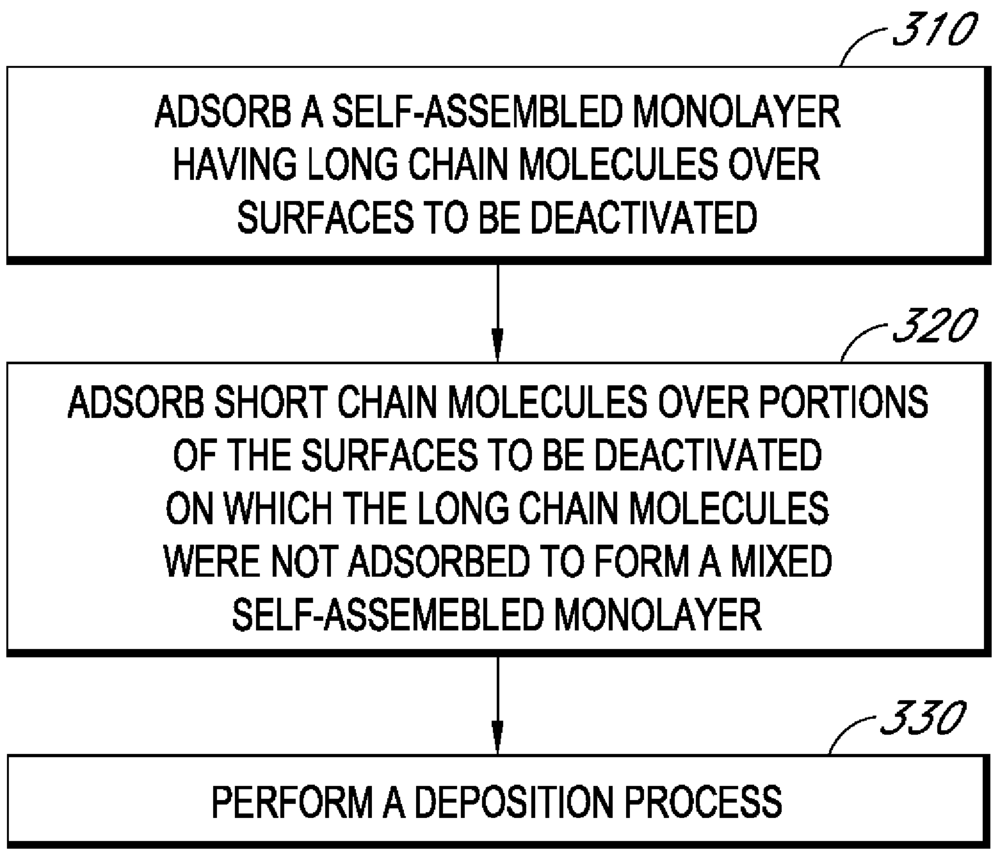
FIG. 3A is a flow chart of a process for forming a mixed self-assembled monolayer having long-chain molecules and short-chain molecules, followed by deposition, according to some embodiments.

FIG. 3A is a flow chart of a method for forming a mixed self-assembled monolayer having long-chain molecules and short-chain molecules according to some embodiments. The method comprises adsorbing 310 a self-assembled monolayer having long-chain molecules over surfaces to be deactivated, followed by adsorbing 320 short-chain molecules over portions of the surfaces on which the long-chain molecules were not adsorbed, to form a mixed self-assembled monolayer. In some embodiments, the surfaces comprise reactor walls, while in other embodiments, the surfaces comprise surfaces on a substrate, such as a partially fabricated integrated circuit. Disassembled reaction parts or substrates can be dipped in or sprayed with liquid precursors for the hybrid SAM; alternatively, vapor phase monomer can be delivered to reactor surfaces or a substrate, either in situ in the reactor where ALD is to take place or in a separate tool. In some embodiments, the step of adsorbing 320 short-chain molecules over portions of the surfaces to be deactivated can be repeated. Following adsorption of short-chain molecules, a vapor deposition process (e.g., an ALD process) can be performed 330, where the hybrid SAM deactivates the treated surface(s).

Figure 3B:
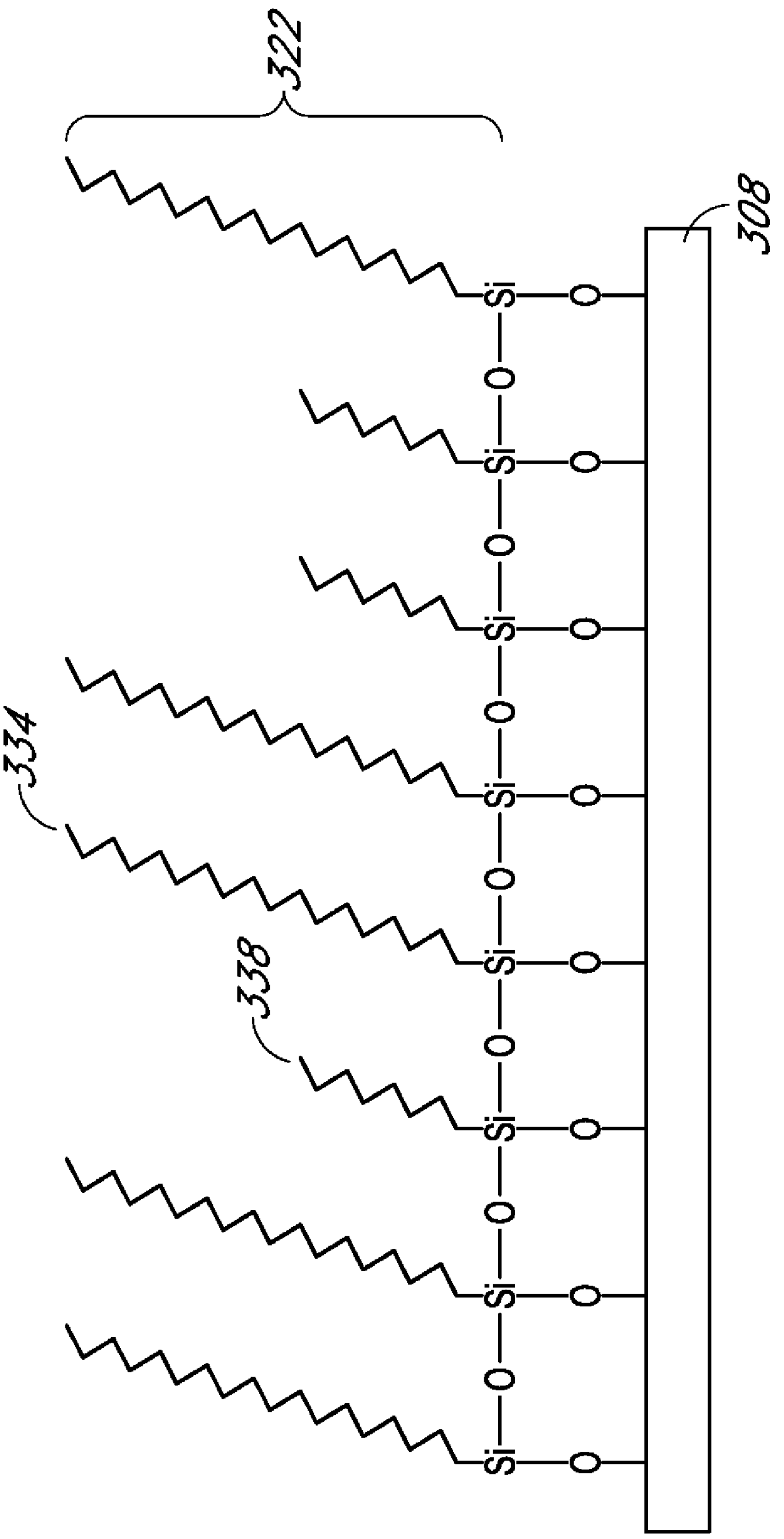
FIG. 3B illustrates a layer having an overlying mixed self-assembled monolayer according to some embodiments.

FIG. 3B illustrates a surface 308 having an overlying mixed self-assembled monolayer 322 formed of first-chain molecules 334 and second-chain molecules 338 shorter than the first chain molecules according to some embodiments. The surface 308, which is meant to be protected by the mixed SAM 322 from undesirable growth or nucleation, can include dielectric surfaces, such as $SiO_2$ surfaces, or conductor surfaces, such as metal or semiconductor surfaces, with or without intervening treatment such as seasoning and hydroxylation. Typically, however, SAM precursors best adsorb onto dielectric or hydroxylated surfaces.

The first-chain molecules 334, which are adsorbed onto the majority of reactive sites of the surface 308, can include but are not limited to organic compounds such as octadecyltrichlorosilane ($(CH_3)(CH_2)_{17}SiCl_3$ or ODTS), tridecafluororo-1,1,2,2-tetrahydrooctyltrichlorosilane (FOTS), tricontyltrichlorosilane (TTS), FOMB(DMA), octyltrichlorosilane ($CH_3(CH_2)_7SiCl_3$), undecyl trichlorosilane ($(CH_3)(CH_2)_{10}$ —$SiCl_3$), and various other monomers and polymerizable molecules, silylating agents, alkylaminosilanes and alkylchlorosilane agents. The second-chain molecules 338, which are diffused among the first-chain molecules 334 and adsorbed onto remaining reactive sites of surface 308 on which the first-chain molecules 338 were not adsorbed, can include but are not limited to shorter chain organic compounds such as trichloromethylsilane (TCMS), trimethylchlorosile (TMCS), trimethylsilanol (TMS) and other haloalkylsilanes and haloalkylsilanols.

In some embodiments, the SAM precursors can comprise a plurality of molecules having a chemical formula selected from the group consisting of $X—R_1—Sh$ or $X—R_1—S—S—R_2—Y$, $R_1—S—R_2$, and combinations thereof, wherein $R_1$ and $R_2$ are chains of n carbon atoms and X and Y are chemical groups. The carbon chain can comprise a portion selected from the group consisting of alkyl, alkenyl, alynyl, cyclic alkyl, aryl, or any combinations thereof. In some embodiments, $R_1$ can comprise an alkyl group or an aryl group, while in other embodiments, $R_1$ can comprise an alkyl group and an aryl group. The number of carbon atoms n can be between 1 and 30. In some embodiments, the number of carbon atoms n is greater than or equal to eight for long-chain molecules, while n is less than eight for short-chain molecules. In one embodiment, n is greater than or equal to twelve for long-chain molecules. In one embodiment, n is less than or equal to six for short-chain molecules.

Other SAM precursors, in addition to those above, are identified in U.S. patent application Ser. No. 11/565,478, filed on Nov. 30, 2006, and herein incorporated by reference in its entirety, including organosilanes such as alkyldisilazanes, aryldisilazanes, and alkylaryldisilazanes as shown in Formula (1) below, as well as alkylhalosilanes, arylhalosilanes, and alkylarylhalosilanes as shown in Formula (2) below.

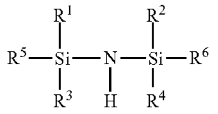
(1)

In Formula (1), $R^1$ through $R^6$ are each individually $C_1$ to $C_6$ alkyl or $C_6$ to $C_{10}$ aryl. Formula (1) includes alkyldisilazanes where $R^1$ through $R^6$ are alkyl, aryldisilazanes where $R^1$ through $R^6$ are aryl, and alkylaryldisilazanes where at least one of $R^1$ through $R^6$ is an alkyl and at least one of $R^1$ through $R^6$ is an aryl.

$$R^7{}_pR^8{}_qR^9{}_rSiX_{4-p-q-r} \quad (2)$$

In Formula (2), $R^7$ through $R^9$ are each individually selected from the group consisting of $C_1$ to $C_{20}$ alkyl and $C_6$ to $C_{10}$ aryl; where p, q, and r are each 0, 1, 2, or 3 with the proviso that $1 \leqq p+q+r \leqq 3$; and where each X is a halogen atom. Formula (2) includes alkylhalosilanes where $R^7$ through $R^9$ are alkyl, arylhalosilanes where $R^7$ through $R^9$ are aryl, and alkylarylhalosilanes where at least one of $R^7$ through $R^9$ is an alkyl and at least one of $R^7$ through $R^9$ is an aryl. Other SAM precursors can also include alkoxysilanes, such as RSiOR', where $R'=CH_3$, $CH_2CH_3$, etc.

The combination of the first-chain molecules and second-chain molecules forms a mixed or hybrid SAM 322 that effectively blocks and reduces the number of available reactive sites in the surface 308 that would undesirably react with a deposition precursor, greatly slowing nucleation of deposition on the deactivated surface 308. In certain instances, motion of the tails of the surface-bound SAM molecules can occur, causing the assembled monolayer to intermittently "open" to allow easier ALD precursor access to unoccupied surface sites (e.g. $HfCl_4$ to —OH).

One skilled in the art will appreciate that selecting particular SAM precursors can be based on the operating conditions for the deposition against which the SAM is to deactivate. For example, if a deposition process takes place at 400° C., the selected precursor should be able to withstand such conditions without decomposing or reacting. In addition, selecting the particular SAM precursors can be based on the ALD precursors to be used; the SAM precursors should be chosen so that there is no deposition on the SAM.

In some embodiments, the mixed SAM having long-chain and short-chain molecules is highly hydrophobic. The "self-assembly" can result from precursor molecules having a hydrophilic end attracted to the surface to be deactivated, and a hydrophobic end that faces outward. Resultant hydrophobic SAMs, when deposited over an underlying layer, resist reactions between typical ALD precursors and the underlying layer, and are characterized by high water contact angles. To achieve high water contact angles, the packing density of the SAM must be very high. It has been found that water contact angle improves by using SAM precursors having long carbon chains. It has also been found that when using a SAM to prevent ALD film deposition on select surfaces, there is an accompanying decrease in the ALD film thickness deposited on the treated surfaces when the number of carbon atoms in the SAM increases, thereby suggesting a more densely packed SAM when the number of carbon atoms is higher.

Accordingly, studies have suggested that relatively long chain molecules are effective in deactivation against ALD. Thus, in some embodiments, the first SAM precursor having long-chain molecules that adsorb on the underlying layer has greater than or equal to eight carbon atoms, more preferably greater than or equal to twelve carbon atoms. This first SAM precursor adsorbs across the majority of the surface to be deactivated against subsequent deposition and obtains the benefits of long chain SAMs as noted above. In contrast, the second SAM precursor having short-chain molecules that diffuse amongst the long-chain molecules has less than eight carbon atoms, more preferably less than or equal to six carbon atoms. Using such SAM precursors, it is possible to form a mixed or hybrid SAM that is highly hydrophobic and which has a water contact angle of greater than 100 degrees, and in some embodiments, over 108 degrees.

In a preferred embodiment, the mixed SAM is formed of a first SAM precursor having a molecular chain length greater than or equal to twelve carbon atoms (such as ODTS) and a second SAM precursor having a molecular chain length less than or equal to six atoms (such as TCMS). Because the second SAM precursor only fills in gaps in the first SAM precursor, the second SAM precursor in most embodiments represents less than 30%, preferably less than 10%, or typically less than 5% of the adsorbed hybrid or mixed monolayer, by surface area or by molar ratio. For purposes of determining these percentages, surface areas do not refer to the reactor surfaces on an atomic scale, since some of the reactor surfaces may be inaccessible to the precursors. Rather the percentages refer to percentages of the SAM coating represented by each of the long and short precursors. Alternatively, the second precursor can represent less than 10% and typically less than 5% of available hydroxyl sites on the reaction surface to be deactivated.

Using a mixed SAM, it is possible to deposit material on certain exposed surfaces, while preventing or minimizing the deposition of material on other surfaces. In some embodiments, the mixed SAM can be formed on reactor surfaces prior to performing a deposition process, thereby preventing undesirable film buildup during the deposition process and reducing reactor contamination, while blanket or selective deposition occurs on a substrate loaded into the reactor. In other embodiments, the SAM can be formed on certain surfaces of a patterned substrate (e.g., a partially fabricated integrated circuit), thereby allowing deposition on some surfaces of the patterned substrate while preventing or minimizing deposition on other surfaces as part of a selective deposition process. The SAM can be formed on the reactor or substrate surfaces of interest ex situ, e.g., by spraying or dipping parts or substrates in liquid ex situ by vapor deposition in a separate chamber; or be vapor deposition in situ.

A. Mixed SAM for Deactivation of Reactive Sites on Reactor Surfaces

Methods are described that utilize a mixed SAM on reactor surfaces to prevent or minimize film buildup during deposition on substrates, such as semiconductor wafers, for integrated circuit fabrication. In some embodiments, after forming a mixed SAM on reactor surfaces and processing one or more substrates, the reactor can undergo an in situ repair to repair the mixed SAM prior to processing additional substrates. In other embodiments, after forming a mixed SAM on reactor surfaces and processing one or more substrates, the reactor can undergo an ex situ stripping process to remove deposition buildup and optionally replace the mixed SAM prior to processing additional substrates. Both in situ and ex situ processes can be conducted in combination, typically with ex situ cleaning (and re-application) conducted with less frequency than in situ repair. In some embodiments, the in situ repair and/or ex situ stripping process can be repeated. In situ repair can also be omitted.

Figure 4A:
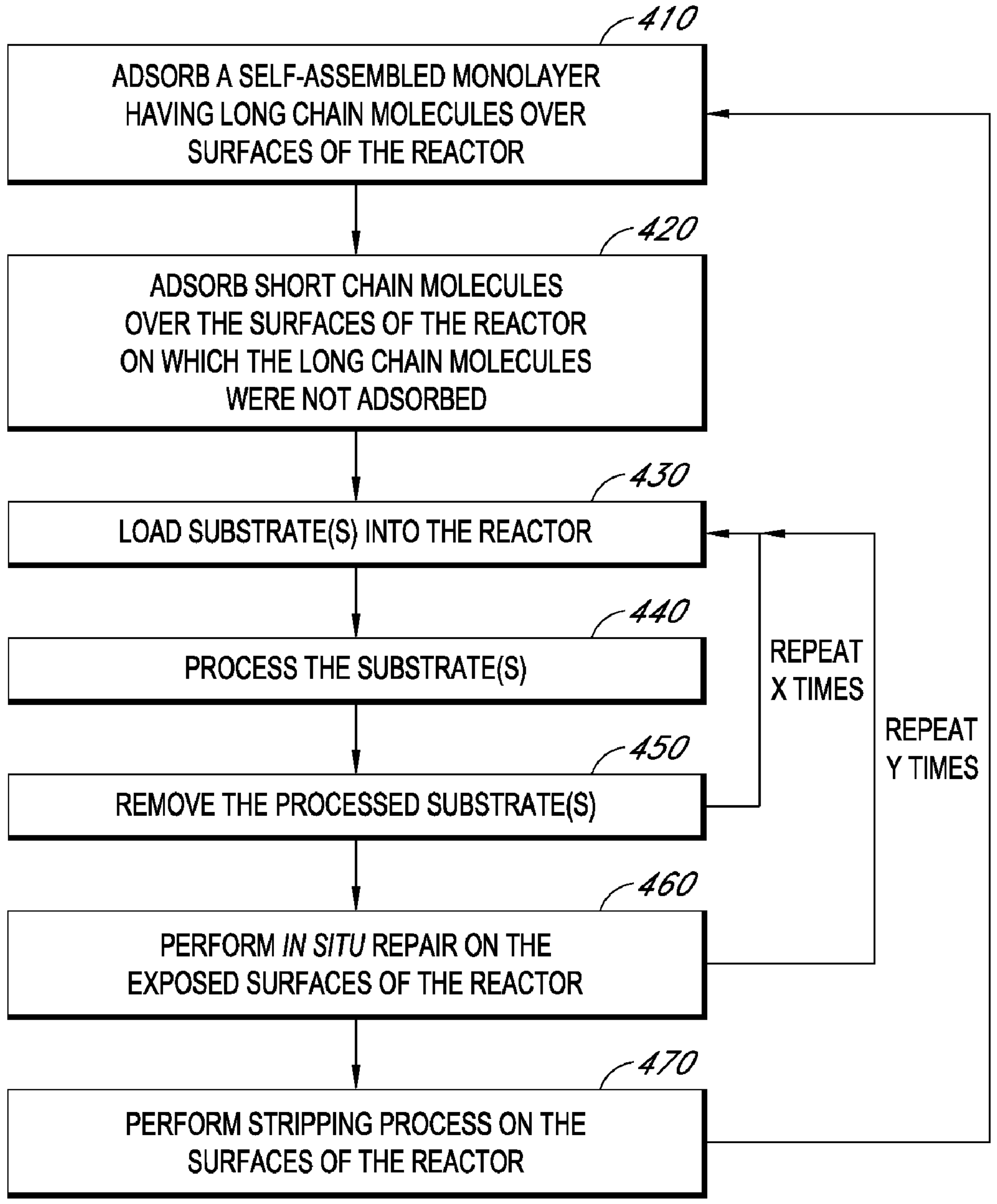
FIG. 4A is a flow chart of a method for processing multiple substrates in sequence utilizing a mixed self-assembled monolayer on surfaces of a reactor according to some embodiments.

FIG. 4A is a flow chart of a method for processing one or more substrates utilizing a mixed self-assembled monolayer on exposed surfaces of a reactor according to some embodiments. The method comprises adsorbing 410 a SAM having long-chain molecules over the exposed surfaces of a reactor; adsorbing 420 short-chain molecules over remaining unoccupied sites of the exposed surfaces of the reactor on which the long-chain molecules were not adsorbed; loading 430 a substrate into the reactor; processing 440 the substrate by vapor deposition thereon wherein the reactor surfaces are deactivated against the vapor deposition by the mixed SAM; and removing 450 the processed substrate. The load/process/remove cycle 430/450/460 can be repeated X times, during which there may be deterioration of the mixed SAM deactivating layer. Thus, after X substrates are processed, it may be desirable to optionally repair 460 the mixed SAM, shown in FIG. 4A as an in situ repair. Even with some cyclical repair, it is likely that eventually there will be some deposition buildup on the mixed SAM, making it desirable to perform a stripping or cleaning process 470 after every Y repairs. After stripping, a mixed monolayer can be reapplied. The entire process, including any repeated cycles of processing, repair and stripping can be referred to as sequential processing and chamber conditioning loops.

To prepare the reactor for wafer processing, a first SAM precursor having long-chain molecules is supplied and adsorbed 410 over exposed surfaces of the reactor. The first SAM precursor can be in situ or ex situ, in either liquid or vapor form, and in some embodiments, can include any of the long-chain SAM precursors described above, such as ODTS, FOTS and TTS. For example, in some embodiments, the first SAM precursor comprises a liquid solution of ODTS. The first SAM precursor can be introduced either in vapor form in situ within a reactor chamber, in vapor form in a different chamber, or ex situ outside of a reactor chamber (e.g., dipping parts in solution if the reactor chamber is disassembled), and made to contact surfaces of the reactor that will be exposed to the later vapor deposition process. The long-chain molecules of the first SAM precursor adsorb and form a SAM on exposed surfaces of the reactor, which may have previously undergone a hydroxylation process. For in situ application, after a certain period of time, the flow of the first SAM precursor is stopped and an optional purging process can be performed to remove any of the first SAM precursors remaining in the reactor. For liquid precursors, the parts can be rinsed of excess precursor.

A second SAM precursor having short-chain molecules can then be introduced and adsorbed 420 over remaining unoccupied reactive sites of the reactor surfaces on which the long-chain molecules were not adsorbed. Like the first SAM precursor, the second SAM precursor can be in either liquid or vapor form, and can include any of the short-chain SAM precursors described above, such as TCMS or TMS. The second SAM precursor can also be introduced either in situ within the reactor chamber or ex situ outside of the reactor chamber (e.g., if the reactor chamber is disassembled), and made to contact surfaces of the reactor that will be exposed to the later vapor deposition process. Typically, the short-chain SAM precursors can be more readily volatized, such that in situ application is easier than for the long-chain molecules. The short-chain molecules of the second SAM precursor diffuse among the long-chain molecules, and adsorb onto sites on which the long-chain molecules were not adsorbed, thereby forming a mixed SAM. The short-chain molecules help to reduce the number of available reactive sites that would otherwise be available if using only the long-chain molecules. For in situ applications, after a certain period of time, the flow of the second SAM precursor can be stopped and an optional purging process can be performed to remove any of the second SAM precursor remaining in the reactor. For liquid precursors, the parts can be rinsed of excess precursor.

In some embodiments in which SAM precursors are introduced into a reactor in vapor form, the SAM precursors can be introduced into the reactor at a temperature of between about 80 and 400° C. and a pressure between about 0.01 and 100 Torr. In some embodiments, the first SAM precursor comprises a vapor having a flow rate of between about 10 sccm and 10 slm, while in other embodiments, the first SAM precursor comprises a liquid having a flow rate of between about 50 sccm and 500 sccm. In some embodiments, the second SAM precursor comprises a vapor having a flow rate of between about 10 sccm and 10 slm, while in other embodiments, the second SAM precursor comprises a liquid having a flow rate of between about 50 sccm and 500 sccm. In other embodiments, rather than providing a flow of a first or second SAM precursor, parts of a reactor can be dipped in a liquid vat to adsorb SAM molecules thereon.

After forming the mixed SAM, a substrate can be loaded 430 into the reactor. In some embodiments, the reactor can be a batch reactor such that a plurality of substrates can be simultaneously loaded 430 into the reactor for processing.

After loading 430 the substrate(s) into the reactor, the substrate(s) can be processed 440. Suitable vapor deposition processes include chemical vapor deposition (CVD) or atomic layer deposition (ALD). In ALD processes, gaseous precursors are supplied, alternatingly and repeatedly, to form a thin film of material on a substrate. Various types of material can be deposited, including oxides, metal oxides, and high-k dielectrics by introducing adsorption driven precursors (e.g., metal halide precursors) that do not react with the hydrophobic surface of the SAM. Due to the formation of the mixed SAM on exposed surfaces of the reactor, the surfaces of the reactor are protected from or deactivated against reacting with deposition precursors during wafer processing. The mixed SAM thus helps to reduce the amount of contamination in the reactor caused by delamination or flaking of film buildup on reactor surfaces that results over time from sequential deposition on multiple substrates or multiple batches. Reducing the amount of precursor adsorption on the exposed surfaces of the reactor additionally helps chemical utilization and allows for shorter ALD pulse/purge cycle times due to reduced pulse overlap due to surface desorption (e.g., outgassing).

Following substrate processing 440, the processed substrate(s) can be removed 450. After substrate removal 450, in some embodiments, one or more additional substrate(s) (or batches) can be loaded 430 into the reactor in sequence for processing 440. As shown in FIG. 4A, the steps of loading 430 substrate(s), processing 440 the substrate(s) and removing 450 the substrate(s) can be repeated X number of times before performing an in situ repair 460 on the exposed surface.

With the novel use of a mixed SAM, an optional in situ repair 460 can refresh the deactivating SAM and increase reactor productivity by further delaying ex situ cleaning compared to conventional deposition processes that use only a single-precursor SAM or no SAM. In some embodiments, an in situ repair of the mixed SAM layer can comprise exposure to both long-chain molecules and short-chain molecules (e.g., first and second SAM precursors), or just short-chain molecules alone (e.g., second SAM precursors), which can provide a level of surface deactivation performance that is akin to the originally deposited mixed SAM, but with much shorter exposure time. In some embodiments, a repair need only occur between one to three times per day, more preferably between one and two times per day. In a particular example, ALD deposition of a $HfO_2$ film of 20 Å thickness on individual wafers is conducted in a single wafer ALD chamber. The system can process about 15 wafers per hour, or approximately 300 wafers per day. Applying the mixed SAM enables continuous processing of 100-200 wafers between in situ repair processes, and can delay chamber cleaning or stripping processes even more.

The purpose of the in situ repair 460 is to repair or refresh the mixed SAM formed on exposed surfaces of the reactor to maintain its desirable protective or blocking properties. Repair may be desirable because parts of the mixed SAM may breakdown and/or desorb over time due to vacuum conditions and high temperatures, resulting in the exposure of previously inaccessible reactive sites including M-OH or O-M-O bridge sites. Even with small and sparse reactive sites exposed, aggregated film buildup can occur over the mixed SAM after performing multiple deposition processes, such as additional M-OH groups that form with ALD cycling, that can reduce the effectiveness of the mixed SAM. It is contemplated that in situ repair 460 will further delay build-up of deposition on the reactor walls, even after some nucleation has begun, thus reducing the frequency of cleaning 470.

In some embodiments, the in situ repair 460 comprises re-introducing one or both SAM precursors to adsorb on surfaces of the reactor, e.g., such as where the mixed SAM may have been damaged or removed, or deposition has begun during the substrate processing cycles 430-450, as part of a larger cyclical process. While in some embodiments, the repair comprises introducing SAM precursors having both long-chain molecules and short-chain molecules, in other embodiments, the repair comprises introducing SAM precursors having only short-chain molecules. An example of such an in situ repair using either long-chain molecules and short-chain molecules, or just short-chain molecules, is described further with respect to the flow chart in FIG. 5B.

Referring still to FIG. 4A, the in situ repair can be performed after processing X number of substrates, such as after running one cassette (25) of wafers in series up to running a full day of sequential single wafer processing (e.g., 100-200 wafers). In some embodiments, the steps of processing X number of substrates followed by an in situ repair can be repeated cyclically Y number of times. For example, in some embodiments, the smaller cycle including an in situ repair 460 process can be repeated between 1 and 10 times.

However, it is expected that the deactivation using mixed SAMs, even with periodic repair, will not eliminate the need for in situ or ex situ stripping 470. Rather, it is expected that the mixed SAMs will delay, or reduce the frequency, of such cleaning relative to reactors using single precursor SAMs to deactivate (see e.g., U.S. Pat. No. 7,118,779 to Mohith et al.). The frequency of having to perform cleaning is reduced. This is particularly beneficial with respect to ex situ cleanings, as during each ex situ cleaning, the reactor is inoperable for significant amounts of time. The reduced frequency of stripping (particularly ex situ stripping) thus provides higher productivity.

It is likely that a stripping 470 or cleaning process on the exposed surfaces of the reactor will be desirable with a certain frequency, whether or not the in situ repair 460 process is used. The purpose of the stripping 470 process is to remove any deposition build-up from the reactor surfaces. In some embodiments, the mixed SAM is also stripped from the reactor surfaces and a new, replacement SAM will be provided in preparation for further wafer processing. In some embodiments, an ex situ stripping process comprises disassembling the reactor and performing a typical cleaning process, such as bead blasting and standard chemical cleaning of the reactor surfaces. Such standard cleans will likely remove the deactivating mixed SAM also. Alternatively, a separate SAM removal step, such as plasma etching, can additionally be employed. As shown in FIG. 4A, the stripping process 470 can be performed after performing Y number of in situ repairs, or processing X times Y number of substrates or batches. In some embodiments, by using a mixed SAM on reactor surfaces to block reactive sites, with or without periodic repair 460, a clean 470 can be conducted only once every 10-30 weeks. Currently, using a single wafer reactor (e.g., ASM Pulsar™, available from ASM America, Inc. of Phoenix, Ariz.) for depositing 5-50 Å of $HfO_2$ on each wafer, cleaning is conducted about every 3 weeks without the benefit of a SAM. Thus, frequency of cleaning 470 is reduced by a factor of approximately 3-10 relative to the frequency without deactivation. This reduced frequency of having to perform an ex situ stripping is particularly beneficial, as each time an ex situ repair is performed, the reactor is disassembled and inoperable, and therefore, the lesser the frequency of performing an ex situ repair, the higher the productivity. The skilled artisan will appreciate that, while FIG. 4A illustrates stripping 470 after a repair process 460 for convenience of illustrating the frequency of the loops, in reality it is more likely that the last repair step before a stripping process 470 would be omitted (see e.g., FIG. 4B).

Figure 4B:
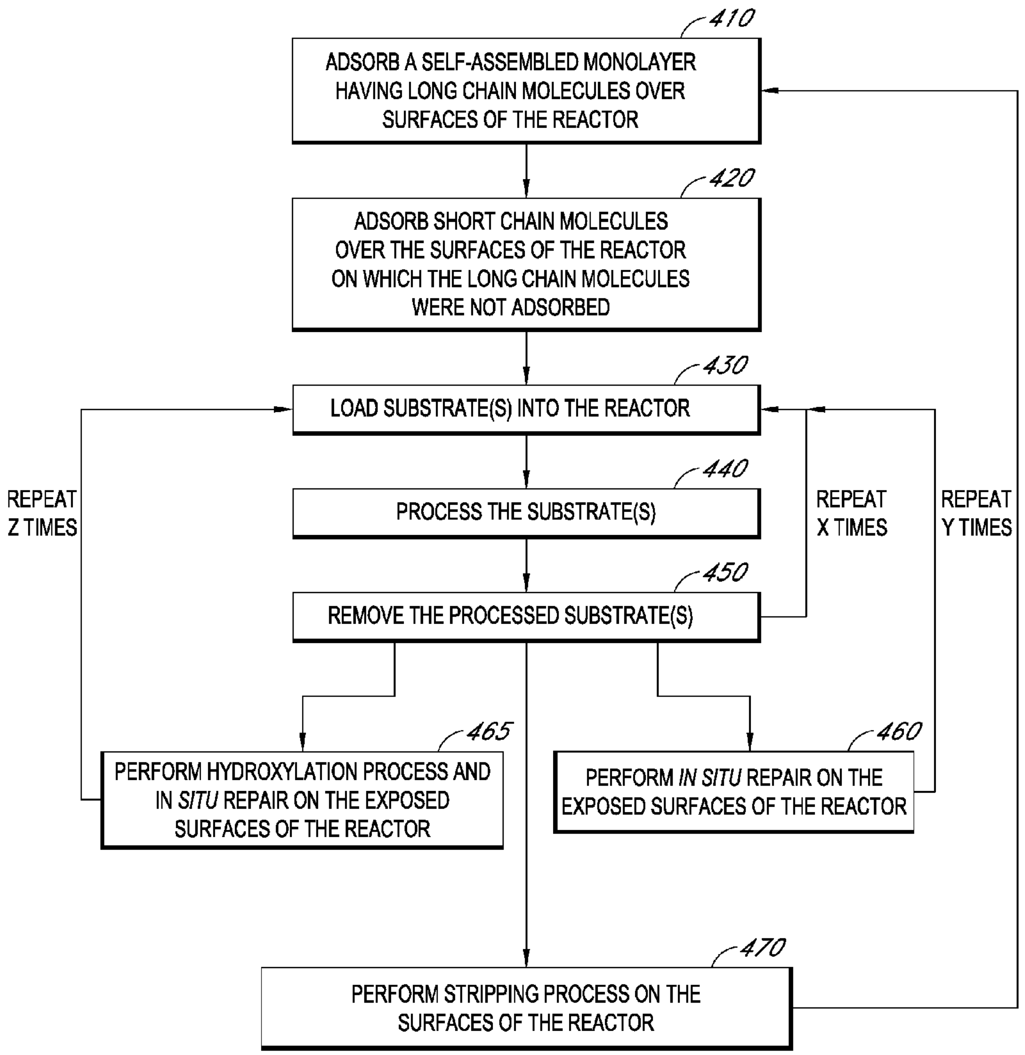
FIG. 4B is a flow chart of an alternative method for processing multiple substrates in sequence utilizing a mixed self-assembled monolayer on surfaces of a reactor according to some embodiments.

FIG. 4B is a flow chart of an alternative method for processing one or more substrates utilizing a mixed self-assembled monolayer on exposed surfaces of a reactor according to some embodiments. While the flow chart in FIG. 4B shares many of the same process steps as the flow chart in FIG. 4A, the flow chart in FIG. 4B separately lists an optional hydroxylation process to be performed with a repair process that can be repeated Z number of times. The purpose of the hydroxylation process is to provide exposed surfaces with the maximum number of reactive sites comprising —OH (e.g., M-OH) hydroxyl groups prior to re-introducing short-chain SAM molecules, or long and short-chain SAM molecules, as part of an in situ repair. The hydroxylation process can include introducing an oxygen-containing vapor, a long water pulse or multiple water pulses towards the exposed surfaces.

With reference to FIG. 4B, a representative process is described. The entire process, including any repeated cycles of processing, repair, hydroxylation and repair, and stripping illustrated in FIG. 4B can be referred to as sequential processing and chamber conditioning loops. In a reactor, a self-assembled monolayer having long-chain molecules (e.g., ODTS) can be adsorbed 410 onto surfaces of the reactor. Short-chain molecules (e.g., TMCS) can then be adsorbed 420 over surfaces of the reactor on which the long-chain molecules were not adsorbed, thereby forming a mixed SAM on the reactor. Once the mixed SAM is formed, a number of wafers can be sequentially loaded 430 into the reactor, processed 440 (e.g., by ALD deposition of $HfCl_4$) and removed 450. After X number of wafers have been processed and removed, an in situ repair process (e.g., introducing short-chain molecules) can be performed 460 similar to that described with respect to FIG. 4A. Following the in situ repair 460, one or more substrates can be loaded, processed and removed. The loop of substrate processing 430-450 and the in situ repair can be repeated a total of Y times before more complex chamber conditioning steps are needed to maintain the deactivating or passivating SAM coating.

In one example of such more complex conditioning, instead of performing just an in situ repair process, a combined hydroxylation process (e.g., introducing an oxygen-containing vapor) followed by an in situ repair process can be performed 465 on exposed surfaces of the reactor. Performing a hydroxylation process prior to the in situ repair helps provide for the maximum number of reactive sites comprising —OH (e.g., M-OH) hydroxyl groups on the reactor surface prior to introducing short-chain molecules or long and short-chain molecules. Following the hydroxylation and in situ repair 465, one or more substrates can be loaded, processed and removed 430-450 X times, followed by simple in situ repair 460, and that loop can be repeated Y times again prior to the hydroxylation/repair process 465. The larger loop including the combined hydroxylation/repair 465 can be repeated a total of Z times. One skilled in the art will appreciate that a combined hydroxylation and in situ repair 465 can be conducted in every repair step in place of simple in situ repair 460.

In another example of more complex chamber conditioning, rather than performing an in situ repair or combination of hydroxylation and in situ repair, a stripping process can be performed 470 on surfaces of the reactor after processing one or more substrates. The stripping process can be either in situ or ex situ and can remove any deposition build-up on the reactor surfaces. After performing the stripping process, a mixed SAM can once again be deposited on the reactor surfaces in preparation for the processing of one or more substrates. One skilled in the art will appreciate that the stripping process can be performed 470 after a select number of in situ repair and/or combination of hydroxylation and in situ repair cycles are performed. Advantageously, the deactivation provided by the mixed SAM greatly reduces the frequency of stripping or chamber cleaning processes.

In one example, ALD deposition of a $HfO_2$ film of 20 Å thickness on each of multiple wafers in sequence is conducted in a single-wafer ALD chamber. The system can process approximately 30-60 wafers, or approximately two or three 25-count wafer cassettes, before requiring an in situ repair, i.e., X=30-60 before conducting in situ repair 460. An in situ repair 460 can take place between 1 and 3 times per day. In addition, in some instances, a hydroxylation and repair process 465 can be performed prior to re-introduction of short-chain molecules, or long and short-chain molecules. The hydroxylation and repair process 465 can be performed with less frequency than the in situ repair 460 without the hydroxylation process, and hence the hydroxylation process can be performed once between every 2 to 3 days, i.e., Y=2-9 between instances of performing hydroxylation and repair 465. Z represents the number of times hydroxylation and repair 465 is performed (including the more frequent included loops of processing wafers 430-450 and repair without hydroxylation 460) before stripping 470.

Figure 5A:
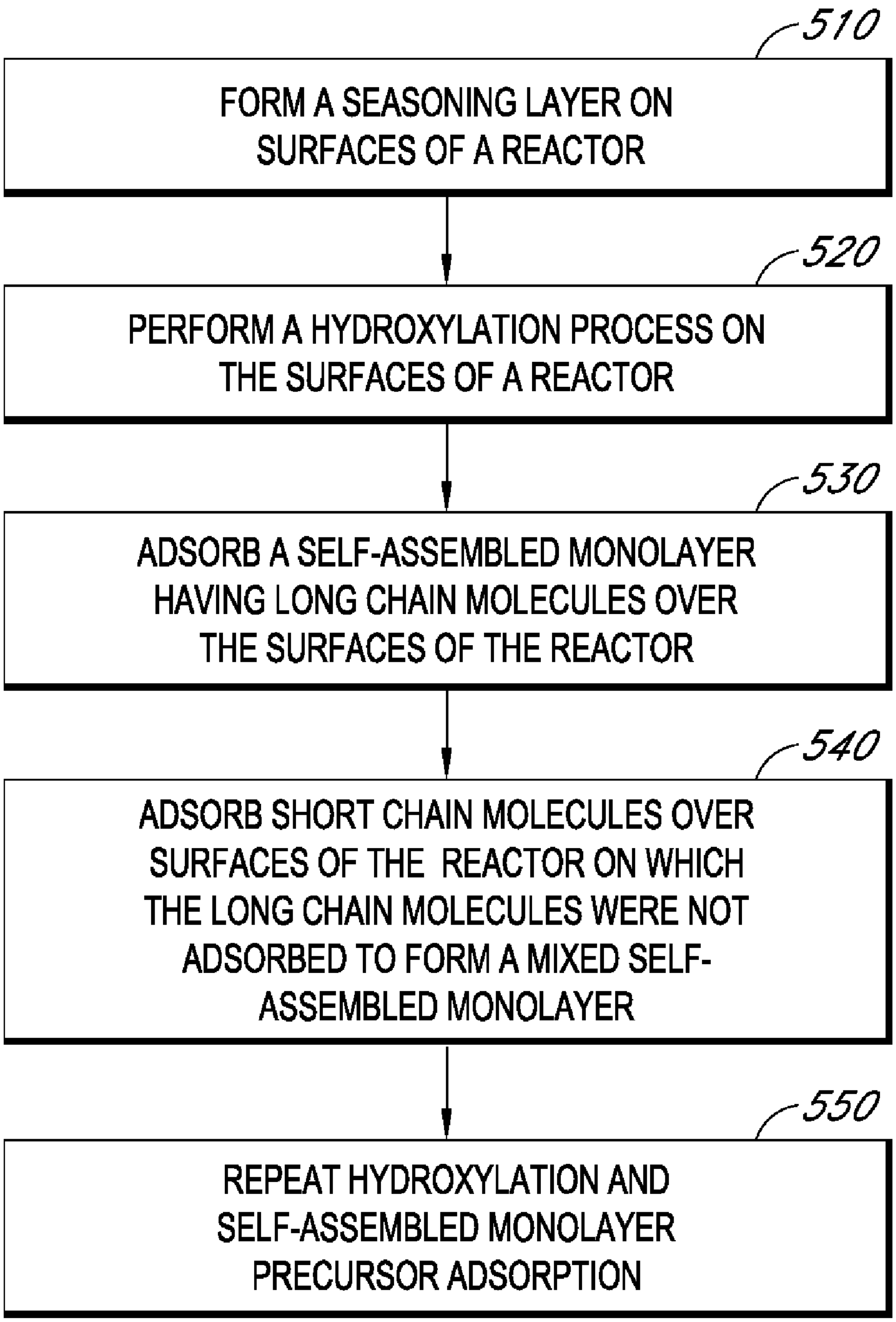
FIG. 5A is a flow chart of a method for forming a mixed self-assembled monolayer on surfaces of a reactor according to some embodiments.

FIG. 5A is a flow chart of a method for forming a mixed self-assembled monolayer on exposed surfaces of a reactor according to some embodiments. While some or all of the steps can be performed ex situ preferably all are performed in situ in the same reactor in which deposition on substrates is to be performed, ensuring a uniform thermal response across surfaces in the reactor. The method comprises forming 510 a seasoning layer on exposed surfaces of a reactor; performing 520 a hydroxylation process on the exposed surfaces of the reactor; adsorbing 530 a self-assembled monolayer (SAM) having long-chain molecules over the exposed surfaces of the reactor; adsorbing 540 short-chain molecules onto any reactive sites of the exposed surfaces of the reactor on which the long-chain molecules were not adsorbed to form a mixed self-assembled monolayer; and optionally, repeating 550 hydroxylation and self-assembled monolayer precursor adsorption. In other embodiments, hydroxylation and SAM adsorption may be performed simultaneously, rather than sequentially.

Prior to forming the mixed SAM on the exposed surfaces of the reactor, a seasoning layer can be formed 510. The seasoning layer helps prepare the reactor for subsequent deposition processes, for example, by providing a layer that has high —OH surface coverage that will allow for a denser SAM layer to be deposited thereover. The seasoning layer facilitates formation of the deactivating mixed SAM. The seasoning layer can be formed by introducing the same precursors into the reactor that will be used for later deposition on substrates. For example, for a reactor designed to deposit $HfO_2$ on substrates, prior to any substrate introduction, one or more pulses of a precursor such as $HCl_4$ can be introduced into the reactor and alternated with pulses of $H_2O$ to coat the exposed reactor surfaces to form $HfO_2$.

After optionally forming 520 the seasoning layer on exposed surfaces of the reactor, a hydroxylation process can be performed 520. The purpose of the hydroxylation process is to provide surfaces of the reactor with the maximum number of reactive sites comprising —OH (e.g., M-OH) hydroxyl groups prior to depositing the deactivating SAM. The hydroxylation process need only be performed on those surfaces on which the deactivating SAM will be formed. Like the seasoning process, the hydroxylation process is optional, although it is recommended to maximize the number of available reactive sites on which the deactivating SAM can be adsorbed. In some embodiments, the hydroxylation process comprises introducing an oxygen-containing vapor, such as ozone gas, a long water pulse or multiple water pulses to the reactor surfaces. In other embodiments, the hydroxylation process comprises introducing a water plasma directly or indirectly, introducing a hydrogen plasma to open a metal-oxide-metal bridge, or introducing other oxidizers in thermal or plasma mode. For example, in some embodiments, the hydroxylation process comprises introducing a flow of ozone gas at a concentration of 5-100% in an $O_2$ flow rate of between 100 sccm and 10 slm for a duration between 1 minute and 1 hour to reactor surfaces. In some embodiments, the oxygen-containing vapor can be introduced continuously or as multiple pulses. The oxygen atoms from the ozone (or other oxygen source) bind naturally to exposed surfaces to form —OH surface groups, which serve as reactive sites for subsequent adsorption of the SAM and provide for a higher density of SAM molecules.

One skilled in the art will appreciate that additional reactive sites can also be created on surfaces of the reactor by using nitrogen, hydrogen and halide surface groups prior to forming a SAM. In some embodiments, the reactor surface is exposed to hydrogen-bearing reactants (e.g., $H_2$, HF, etc.), nitrogen-bearing reactants (e.g., $NH_3$, hydrazine, etc.), or halide-bearing reactants (e.g., $NF_3$, $CF_4$ or other chloro- or fluorocarbons, etc.). Furthermore, this list is not an exclusive list, and reactive sites can comprise a mixture of different types of surface groups.

After optionally performing 520 the hydroxylation process, a self-assembled monolayer having long-chain molecules can be adsorbed 530 over the exposed surfaces of the reactor. The self-assembled monolayer can be formed using any of the SAM precursors described previously.

To form the mixed SAM, short-chain molecules can be subsequently adsorbed 540 over the exposed surface sites of the reactor on which the long-chain molecules were not adsorbed. The mixed SAM can be used to prevent or block deposition precursors from reacting with exposed surfaces of the reactor, thereby reducing the amount of unwanted film buildup over reactor surfaces during wafer processing.

Following formation of the mixed SAM, the hydroxylation process and SAM precursor adsorption can be optionally repeated 550. Cyclically repeating 550 the hydroxylation process and SAM precursor adsorption may allow reaction with temporarily blocked or hidden reactive sites to maximize the number of blocked reactive sites on the exposed surfaces of the reactor. In some embodiments, repeating the hydroxylation process comprises performing the same previously performed hydroxylation process, while in other embodiments, repeating the hydroxylation process comprises performing a different hydroxylation process than previously performed. In some embodiments, repeating the SAM precursor adsorption comprises adsorbing both long-chain molecules and short-chain molecules, while in other embodiments, repeating comprises adsorbing either long-chain molecules or short-chain molecules.

The treatment process of FIG. 5A can be employed in the cyclical treatment and deposition processes of FIG. 4A or 4B.

Figure 5B:
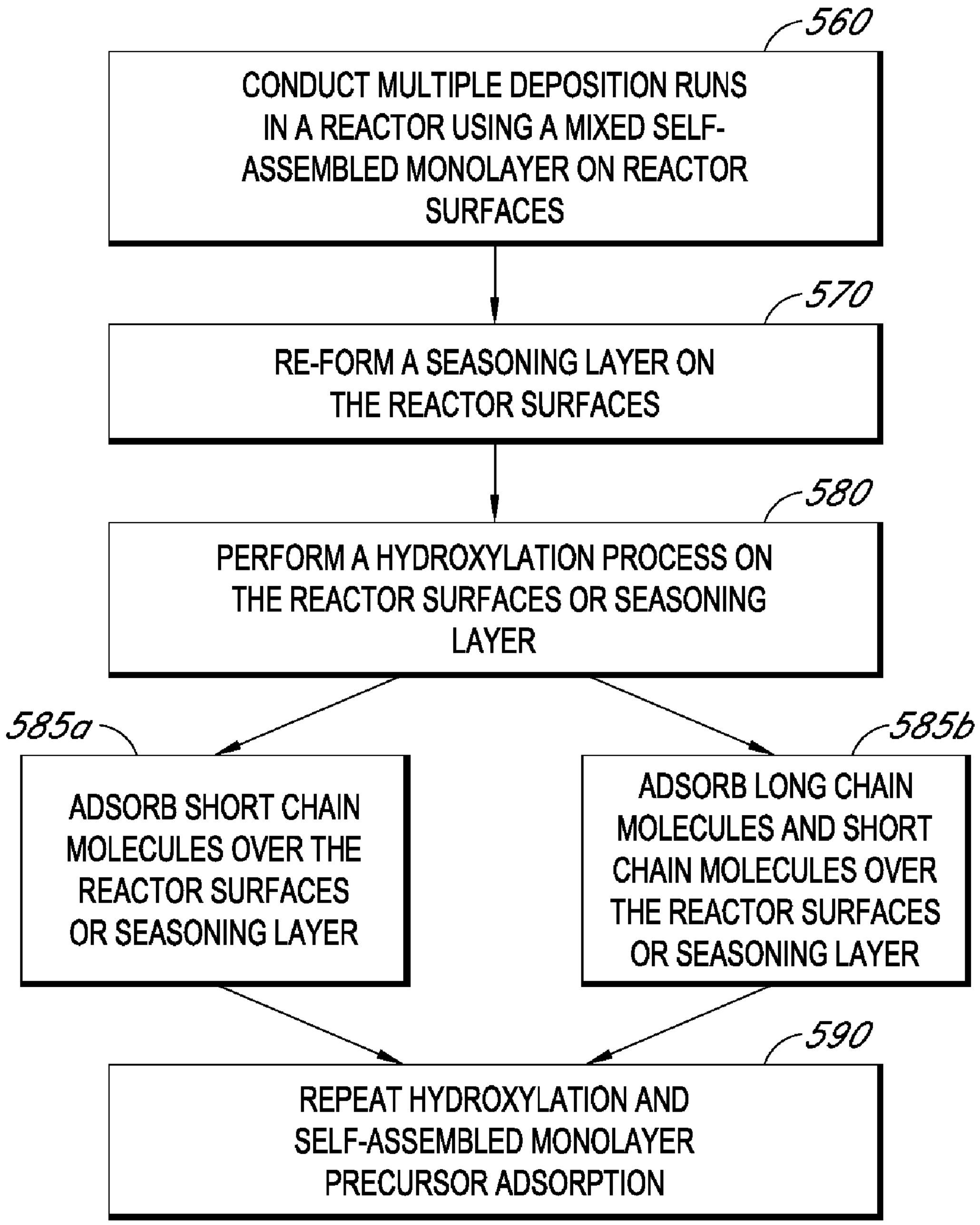
FIG. 5B is a flow chart of a method for repairing a mixed self-assembled monolayer on exposed surfaces of a reactor according to some embodiments.

FIG. 5B is a flow chart of a method for repairing a mixed self-assembled monolayer on exposed surfaces of a reactor according to some embodiments. In situ repair, using vapor phase reactants, can prolong the time between ex situ cleanings and thus minimize reactor downtime. The method comprises conducting 560 multiple deposition runs in a reactor using a mixed SAM on reactor surfaces; optionally re-forming 570 a seasoning layer on the reactor surfaces; performing 580 a hydroxylation process on the reactor surfaces or seasoning layer; either adsorbing **585*a* short-chain molecules over the reactor surfaces or seasoning or adsorbing 585*b* long-chain molecules and short-chain molecules over the reactor surfaces or seasoning layer; and optionally repeating 590** the hydroxylation and SAM precursor adsorption.

After conducting 560 multiple deposition runs in a reactor having a mixed SAM formed on reactor surfaces, in which a number of wafers are processed under CVD or ALD conditions, the mixed SAM may need repair. In some embodiments, the repair comprises adsorbing SAM precursor molecules, as will be discussed with respect to steps 585*a* and 585*b*.

Prior to performing a repair, a seasoning layer can be optionally re-formed 570 on the reactor surfaces. The seasoning layer can be re-formed if, after prolonged deposition runs, significant build-up has already occurred on the walls and a more complete and reliable base is desired for a refreshed deactivation SAM to minimize further deposition on the walls in subsequent substrate processing. A hydroxylation process can be performed 580 on either the pre-existing SAM on the reactor surfaces or on the seasoning layer if re-formed.

After performing 580 the hydroxylation process, the repair process of either refreshing or forming a new mixed SAM can begin. The repair process can include either adsorbing 585*a* only short-chain molecules over the reactor surfaces on any exposed reactive sites, including any optional seasoning layer, or adsorbing 585*b* both long-chain molecules and short-chain molecules over the reactor surfaces (or optional seasoning layer). To perform either adsorption process in 585*a* or 585*b*, SAM precursors are introduced into the reactor.

After adsorbing SAM precursors to repair the mixed SAM, the hydroxylation process and SAM precursor adsorption can be optionally repeated 590. In some embodiments, repeating 590 the SAM precursor adsorption comprises introducing one or more SAM precursors periodically into the reactor. For example, SAM precursors having short-chain molecules can be introduced repeatedly for different durations of time at different flow rates until the mixed SAM is repaired.

In some embodiments, instead of repairing the mixed SAM (e.g., with either short chain and long chain precursors, or just short chain precursors), the adsorbed molecules of the mixed SAM can be purposefully destroyed or removed in situ, e.g., by burning the organic SAM by use of ozone, oxygen, $N_xO_y$, or oxidizing plasma species. For example, with less frequency than repair, the stripping 470 of FIG. 4A or FIG. 4B can be by an in situ strip. By removing the mixed SAM in situ, the processes described above can be advantageously repeated. For example, once the mixed SAM is removed, either in whole or in part by in situ oxidation, a seasoning layer can be deposited on the reactor surfaces, followed by an optional hydroxylation process. Re-applying a seasoning layer and optional hydroxylation process allows for the re-introduction of a first SAM precursor and second SAM precursor to once again deposit a mixed SAM over a clean surface, thus further delaying the need for ex situ repair in some instances. A representative cycle using in situ removal of the mixed SAM that can be repeated is described as follows: in a titanium reactor, introduce a seasoning layer (e.g., of alumina), deposit a SAM (e.g., single or mixed), process multiple wafers, and perform a repair (e.g., re-introduce long-chain molecules or short-chain molecules) or removal (e.g., oxidation) process.

Figure 6A:
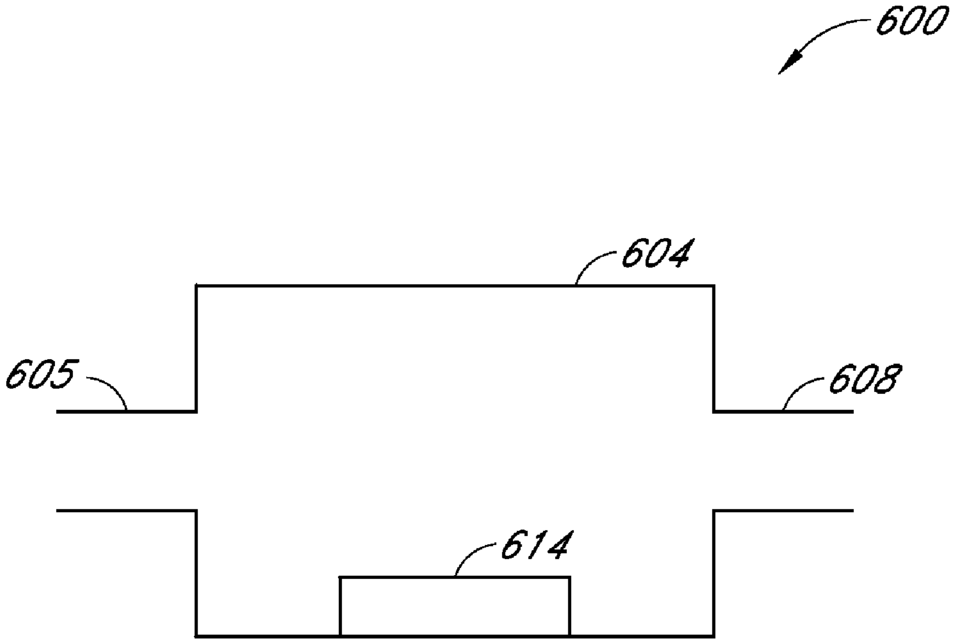
FIG. 6A illustrates a reactor according to some embodiments.

FIGS. 6A-6E are schematic drawings of a reactor 600 undergoing formation of a mixed SAM on its surfaces and subsequent wafer processing. While illustrated for in situ deactivation, it will be understood that the reactor can be disassembled and surfaces treated ex situ by liquid or vapor SAM precursors. FIG. 6A illustrates the reactor 600 and its features according to some embodiments. The reactor 600 can include an inlet port 605, an outlet port 608 and a susceptor 614. The reactor 600 can be a CVD reactor or an ALD reactor or any other type of reactor capable of vapor deposition on subtrate(s) such as silicon wafers. The reactor 600 can be either a single-substrate processor or a batch-substrate processor. Reactor surfaces on which the mixed SAM can be adsorbed can be made of (but are not limited to) the following materials: titanium, titanium alloys, titanium dioxide, nickel, nickel alloys, stainless steel and aluminum oxide. One skilled in the art will appreciate that the reactor is shown schematically only and can take on a variety of other configurations and include other components such as heaters, evaporators or bubblers, control systems for temperature control, control of flow for the deposition precursors, gas distribution system, etc. ALD reactors typically include two or more separate inlets (not shown), one for each reactant to minimize the surfaces at which they can react. Additionally, temperature controllers are typically programmed to maintain surfaces of interest within the reactor (particularly the susceptor 614 and supported substrate) above the precursors' condensation limits and below their decomposition limits.

Figure 6B:
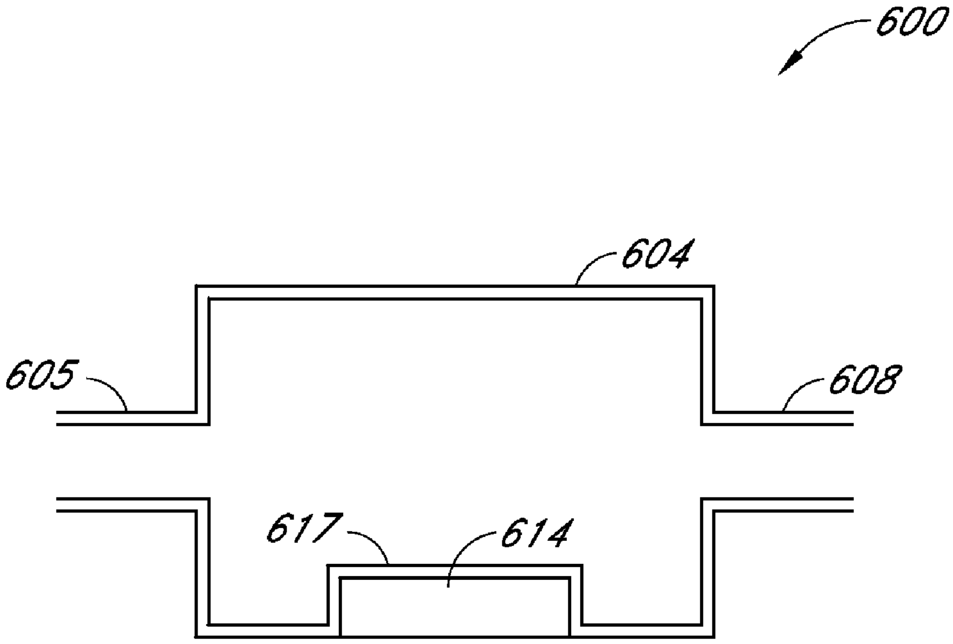
FIG. 6B illustrates the reactor of FIG. 6A after exposure to a seasoning process and hydroxylation process according to some embodiments.

FIG. 6B illustrates the reactor 600 of FIG. 6A after exposure to a seasoning process and hydroxylation process according to some embodiments. The seasoning process and hydroxylation process form a hydroxylated layer 617 that overlies exposed surfaces of the reactor 600, including the reaction chamber 604, adjacent surfaces of the inlet 605 and outlet 608, and the surfaces of the susceptor 614. In some embodiments, during the seasoning process, which can involve the same vapor deposition intended for subsequent substrate processing, such as $HfO_2$ ALD, the reactor is kept at a temperature of between about 200° C. and 500° C. and a pressure between about 0.1 and 10 Torr. In some embodiments, during the hydroxylation process, which can comprise introducing ozone gas, the reactor is kept at a temperature between 100 and 500° C. and a pressure between about 0.1 and 50 Torr.

Figure 6C:
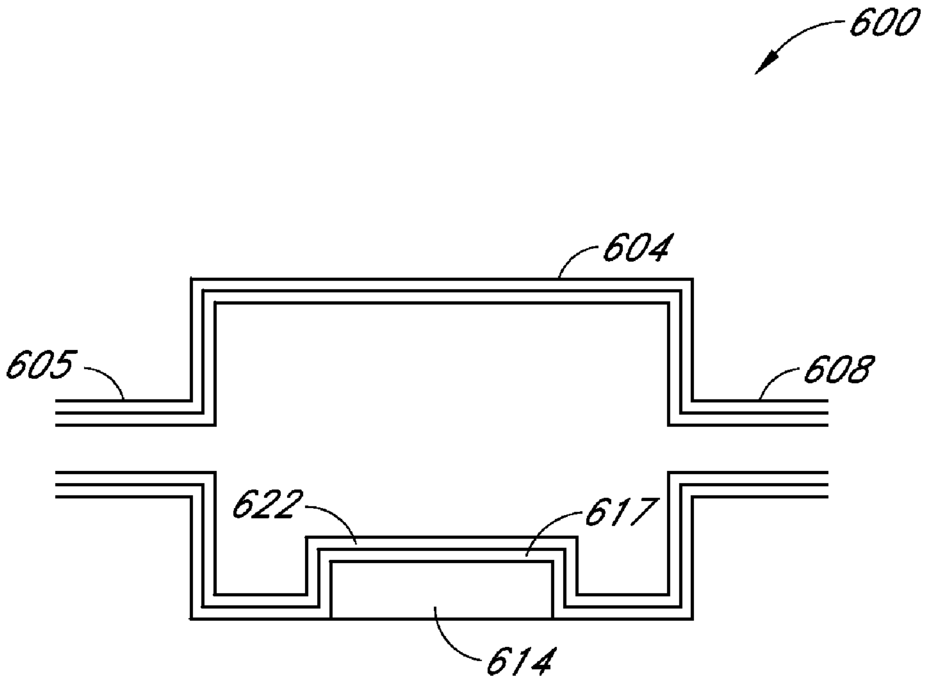
FIG. 6C illustrates the reactor of FIG. 6B after exposure to self-assembled monolayer precursors according to some embodiments.

FIG. 6C illustrates the reactor 600 of FIG. 6B after exposure to SAM precursors according to some embodiments. The SAM precursors include both long-chain molecules and/or short-chain molecules to form a mixed or hybrid SAM 622 over the optional seasoning layer. While in some embodiments, the long-chain molecules and short-chain molecules can be mixed together into a single source material that is introduced into the reactor, in a preferred embodiment, the long-chain molecules and short-chain molecules are introduced sequentially, with the long-chain molecules being introduced first to form a SAM maximizing the advantages of long-chain monomers, followed by interdiffusion of short-chain molecules between the long-chain molecules to block any remaining reactive sites and form the mixed SAM 622. In some embodiments, after introducing a first SAM precursor having long-chain molecules for a certain period of time, the flow of the first SAM precursor can be stopped and a purging process can be performed prior to introducing the second SAM precursor having short-chain molecules. In some embodiments, the purging process comprises introducing an inert gas such as $N_2$, Ar, He, etc. The mixed SAM 622 assists in preventing deposition precursors from adsorbing or reacting on exposed surfaces of the reactor 600.

The SAM is adsorbed onto various surfaces in the interior of the reactor. In some embodiments, the SAM is less than five molecular monolayers in thickness. As shown in FIG. 6C, in some embodiments, the adsorbed SAM 622 can extend to surfaces of the inlet port 605 and outlet port 608 to prevent film buildup in these regions as well.

Figure 6D:
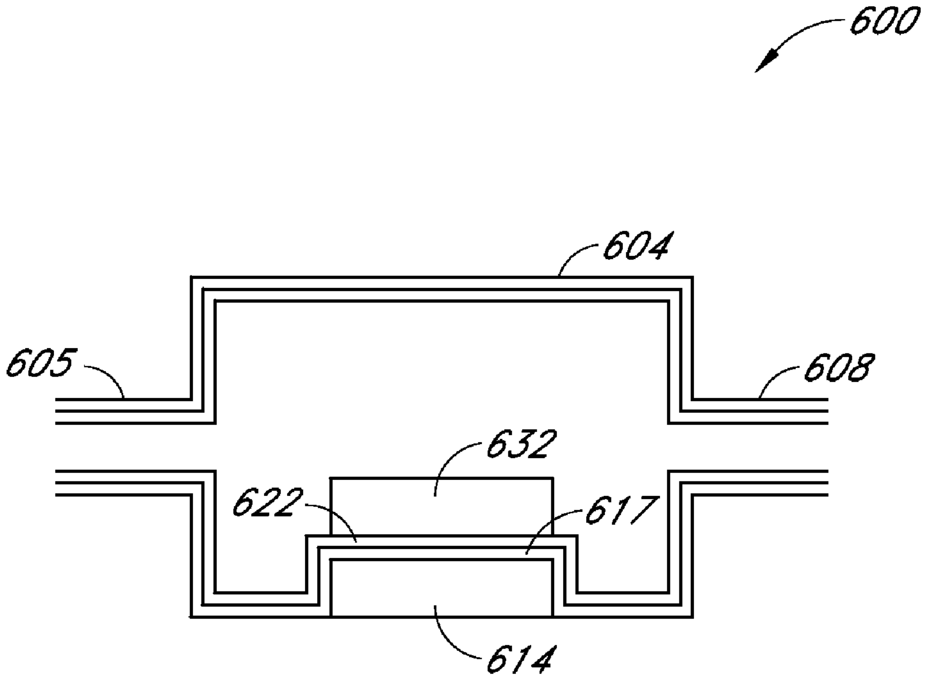
FIG. 6D illustrates the reactor of FIG. 6C after a wafer has been introduced therein according to some embodiments.

FIG. 6D illustrates the reactor 600 of FIG. 6C after a wafer 632 has been introduced to the reaction chamber 604 therein according to some embodiments. Once the wafer is introduced into the reactor 600 and placed on the susceptor 614, the wafer can be processed using a deposition process such as CVD or ALD, particularly adsorption-driven ALD.

Figure 6E:
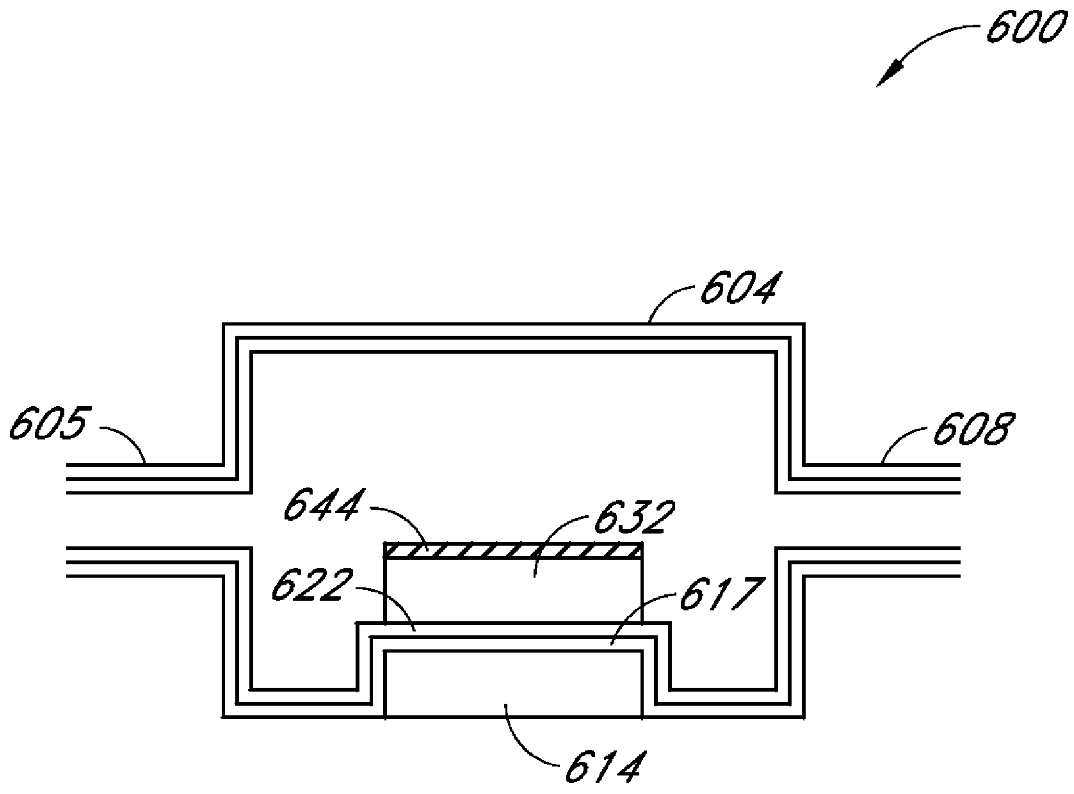
FIG. 6E illustrates the reactor of FIG. 6D after performing a deposition process on the wafer according to some embodiments.

FIG. 6E illustrates the reactor 600 of FIG. 6D after performing a deposition process on the wafer 632 according to some embodiments. In some embodiments, the wafer 632 is processed under standard CVD or ALD processing conditions. The deposition process results in the deposition of a film 644 on the wafer 632. While in some embodiments, a minimal amount of film will be deposited on the mixed SAM 622, the amount deposited on the SAM 622 per wafer can generally be negligible. In some embodiments, the amount of growth on mixed SAM coated reactor surfaces can be between about 1/100 to 1/50 of that on the wafer. In an example, in a recipe that deposits a 20 Å film on wafer 632 after 10 seconds deposits approximately 0.2 Å on the mixed SAM coated reactor surfaces. In general, every 10 Å on the wafer results in the order of tenths of an angstrom or less, and preferably about zero deposition, on the treated walls, such that the deposition on the wafer 632 is selective relative to the treated walls of the reaction chamber 604. If the wafer 632 is properly prepared (see FIGS. 7-8C and attendant description), the deposition can also be selective on portions of the wafer relative to other portions.

After performing the deposition process, the wafer 632 can be removed, and another wafer can be provided for processing. This step can be repeated until completion of a deposition run for a series of wafers. Once a deposition run is completed, in some embodiments, the reactor can be repaired (as discussed previously). In other embodiments, after completing a deposition run, the mixed SAM can be removed, such as by a thermal anneal.

Accordingly, by coating the reactor surfaces with the mixed SAM 622, it is possible to achieve a selective or measurable deposition such that film material is deposited primarily on the wafers without appreciable deposition on the reactor surfaces for any given substrate, reducing the frequency of having to repair or refresh the reactor surfaces by in situ or ex situ processes. Advantageously, the methods described herein using a mixed or hybrid SAM enable a prolonged deposition run (e.g., a greater number of wafers processed) prior to necessitating cleaning, relative to methods that do not use a SAM or use only a single-precursor SAM.

In any of the foregoing embodiments, it is possible that when introducing long-chain molecules and/or short-chain molecules as part of the initial formation process of a SAM for creating a deactivating surface (either formed from just long-chain molecules or both long-chain and short-chain molecules) or during reapplication of or repairing a deactivated surface, a certain percentage of molecules may not be adsorbed properly or chemically bound to the deactivation surface. Such molecules can create imperfections in the self-assembled monolayers and allow deposition on the reactor surfaces during operation. These molecules that are not chemically bound to the deactivated surface can be removed by performing an "extraction" step comprised of a liquid or vapor treatment with a chemical attractor, a thermal treatment, or a vacuum treatment under conditions selected to aid removal of the physically adsorbed molecules without disturbing the chemically adsorbed molecules. Extraction treatment effectively cleans the surface of physically adsorbed molecules and exposes reactive sites for a subsequent exposure to the long and/or short SAM precursors, and extraction can be cycled with the precursor exposure.

B. Mixed SAM Use for Deactivation of Reactive Sites on Device Structures

Methods are described that utilize a mixed SAM on device structures to prevent or minimize material deposition on selected substrate surfaces during substrate processing. By using a mixed or hybrid SAM, a selective deposition can be achieved in which material is deposited on certain surfaces of a device and minimally (if at all) on others during a vapor deposition process (such as a CVD or ALD deposition process).

Figure 7:
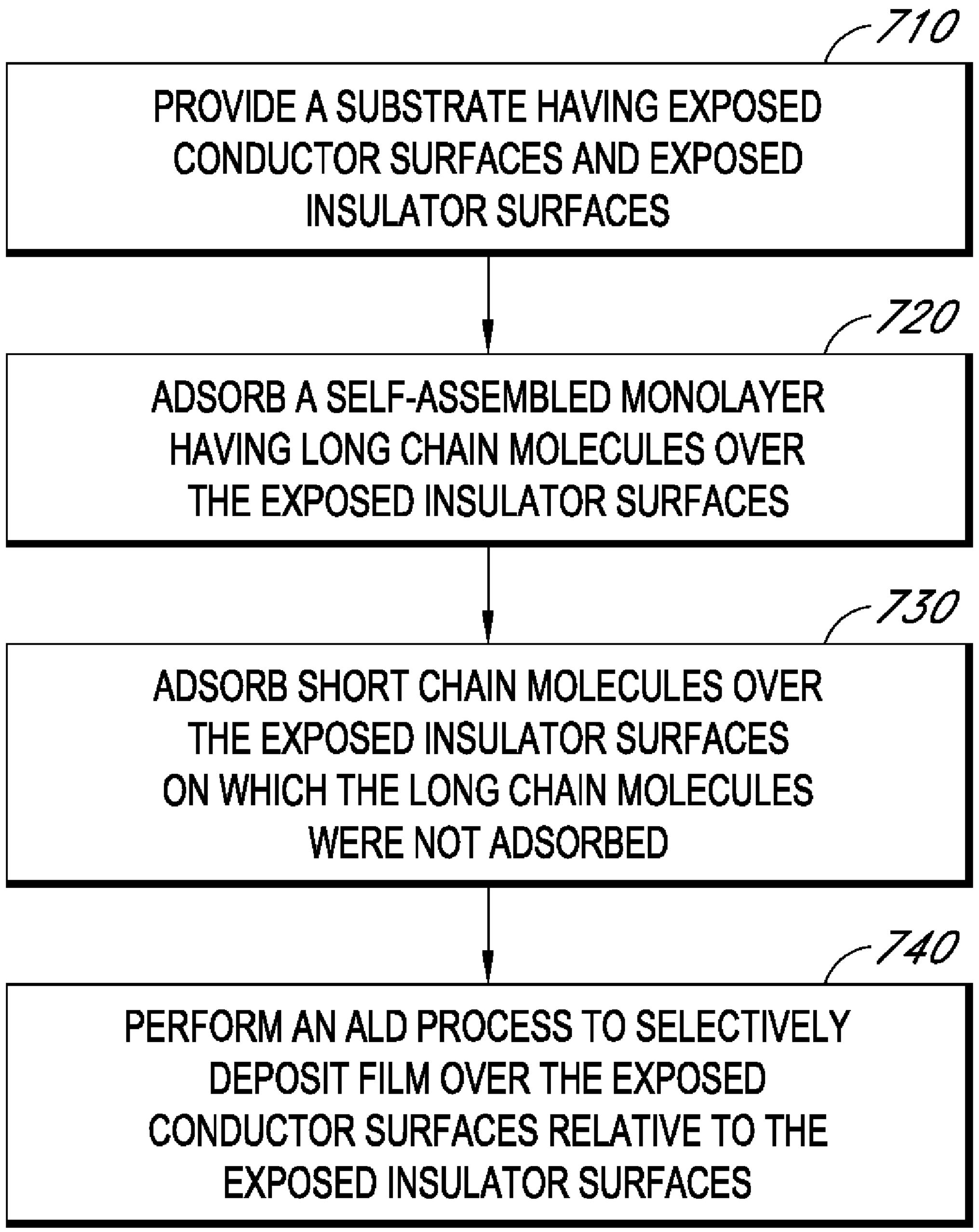
FIG. 7 is a flow chart of a method for selectively vapor depositing layers on portions of a substrate according to some embodiments.

FIG. 7 is a flow chart of a method for selective deposition according to some embodiments. The method comprises providing 710 a substrate having exposed conductor surfaces and exposed insulator surfaces; adsorbing 720 a self-assembled monolayer having long-chain molecules over the exposed insulator surfaces; adsorbing 730 short-chain molecules over the exposed insulator surfaces on which the long-chain molecules were not adsorbed; and performing 740 an ALD process to selectively deposit film over the exposed conductor surfaces relative to the so treated insulator surfaces.

Initially, a substrate is provided 710 that has exposed conductor surfaces and exposed insulator surfaces. The substrate can be a partially fabricated integrated circuit structure. The conductor surfaces can comprise metal surfaces and/or semiconductor surfaces that are optionally doped. The conductor surfaces may be cleaned of native oxide or hydroxyl groups to avoid deactivation by the SAM to be formed.

After providing 710 the substrate, a self-assembled monolayer having long-chain molecules can be adsorbed 720 over the exposed insulator surfaces. Any of the SAM precursors described above, such as octadecyltrichlorosilane ($(CH_3)(CH_2)_{17}SiCl_3$ or ODTS), tridecafluororo-1,1,2,2-tetrahydrooctyltrichlorosilane (FOTS), tricontyltrichlorosilane (TTS), FOMB(DMA), octyltrichlorosilane ($CH_3(CH_2)_7SiCl_3$), and undecyl trichlorosilane ($(CH_3)(CH_2)_{10}$—$SiCl_3$) can be used to provide the long-chain molecules.

After adsorbing 720 the self-assembled monolayer, short-chain molecules can be adsorbed 730 over remaining active sites of the exposed insulator surfaces not occupied by the adsorbed long-chain molecules, thereby forming a mixed SAM over the exposed insulator surfaces. Any of the SAM precursors described above, such as TCMS or TMS, can be used to provide the short-chain molecules. The mixed SAM prevents or minimizes the amount of deposition that occurs over the insulator relative to the conductor surfaces by blocking reactive sites of the insulator, thereby deactivating against subsequent deposition.

As with reactor treatment, SAM formation can be conducted ex situ, in situ, or by a combination of the two. Precursors may be delivered in liquid or vapor form.

After forming the mixed SAM on the exposed insulator surfaces, an ALD process can be performed 740 to selectively deposit film over the exposed conductor surfaces relative to the SAM-treated insulator surfaces. While a film is deposited on the conductor surfaces, e.g., to form a part of a gate electrode structure, only a minimal amount of film (if any) is deposited over the insulator surfaces due to the blocking ability of the mixed SAM. Desirably, completeness of the mixed SAM enables no measurable deposition thereover per wafer processed.

Figure 8A:
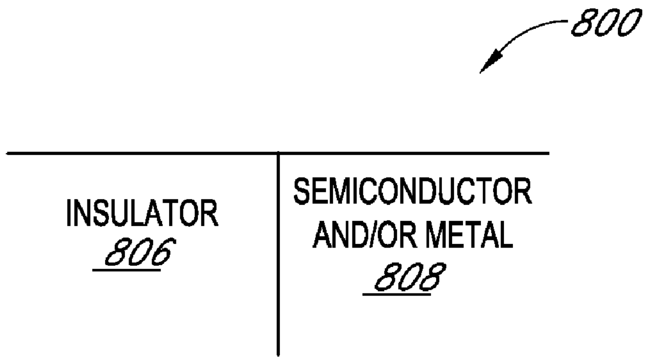
FIG. 8A schematically illustrates a patterned substrate having exposed insulator and semiconductor/metal surfaces according to some embodiments.
Figure 8B:
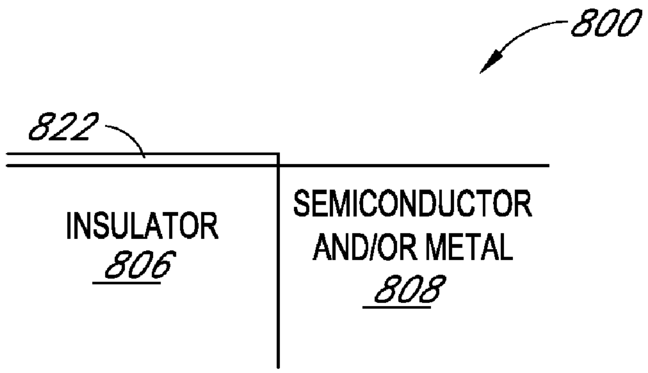
FIG. 8B illustrates the patterned substrate of FIG. 8A after forming a deactivating mixed self-assembled monolayer (SAM) selectively on the exposed insulator.
Figure 8C:
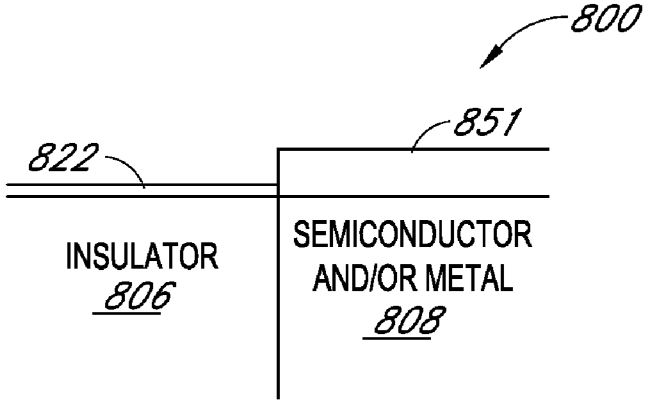
FIG. 8C illustrates the patterned substrate of FIG. 8B after performing a selective deposition process on the exposed semiconductor/metal surfaces without coating the SAM, according to some embodiments.

FIGS. 8A-8C are schematic drawings of a substrate 800 having a mixed surface comprising an insulator 806 and a semiconductor and/or metal 808 undergoing formation of a mixed SAM on the insulator 806 and a subsequent deposition (e.g., ALD) process. The substrate 800 is thus a patterned substrate having exposed insulator 806 and semiconductor/metal surfaces 808. The insulator surfaces 806 and semiconductor and/or metal surfaces 808 can be part of a partially fabricated integrated circuit structure. In some embodiments, the insulator surface is formed by a dielectric film such as $SiO_2$.

FIG. 8B illustrates the substrate 800 of FIG. 8A after forming a mixed or hybrid self-assembled monolayer 822 on the exposed insulator 806. The mixed SAM is formed on a first surface of the patterned substrate (the exposed insulator 806) due to plentiful reactive sites without forming on the second surface of the patterned substrate (the semiconductor and/or metal 808). The mixed self-assembled monolayer 822 can be formed by supplying a first SAM precursor having long-chain molecules and a second SAM precursor having short-chain molecules either together or sequentially, to the exposed surface of the insulator, as described above. In some embodiments, the average thickness (e.g., the average thickness of both long and short chain molecules) of the mixed SAM 822 formed on the insulator is between about 20 and 50 Å. While some of the long-chain molecules and short-chain molecules used to form the hybrid self-assembled monolayer 822 can also be adsorbed onto the semiconductor and/or metal surfaces 808, the amount adsorbed (if any) is minimal and negligible.

FIG. 8C illustrates the substrate 800 of FIG. 8B after performing a selective deposition process on the exposed semiconductor and/or metal surfaces 808 according to some embodiments. The deposition process can comprise a CVD or ALD process (such as any the $HfO_2$ ALD process described below) that deposits a film layer 851 on the semiconductor and/or metal surfaces 808 and relatively less (or preferably none) on the insulator 806. The film layer 851 can comprise a film of $HfO_2$ or $ZrO_2$, or any other film that can be deposited selectively over the semiconductor and/or metal surfaces 808 and not on the insulator surfaces 806. In some embodiments, the film layer can be between 10 and 50 Å, or between 10 and 30 Å. Many metal precursors for ALD, particularly metal halides, will not adsorb on hydrophobic SAM surfaces and thus deposition does not take place thereon. In a particular example, the thickness of the deposited film layer of $HfO_2$ over the semiconductor/metal surfaces is between about 1.0 and 10.0 nm, while no measurable thickness forms over the mixed SAM 822. In some embodiments, the deposited film layer 151 has a thickness uniformity greater than 97%, more preferably greater than 99%, and a step coverage greater than 90%, more preferably greater than 98%.

A more detailed concrete example of ALD is now described. After providing a mixed SAM on reactor surfaces and/or surfaces of a partially fabricated integrated circuit structure in a reaction chamber, one or more substrates can be loaded into the reaction chamber and an ALD process can be initiated. Two reactant gases and a purge gas can be used to form a series of monolayers of hafnium oxide ($HfO_2$). The reactant gases can include hafnium chloride ($HfCl_4$) and $H_2O$. One skilled in the art will appreciate that reactant gases for other ALD processes can also be selected against hydrophobic SAMs, including but not limited to TMA, $ZrCl_4$, alkyl-amides, and alkoxides. The purge gas can include nitrogen ($N_2$). More complex processes can employ three or more reactants, separated by reactant removal steps (e.g., purge pulses), depending on the desired monolayer to be formed on the substrate.

The ALD process begins with setting the substrate temperature above the condensation temperature but below the thermal decomposition temperature of the reactants. The first reactant pulse can start with the $HfCl_4$ being introduced into the reaction chamber. Once in the reaction chamber, the $HfCl_4$ chemically adsorbs on select surfaces of the partially fabricated integrated circuit, typically leaving no more than a monolayer. After the $HfCl_4$ has adsorbed on the desired surfaces, the flow of the $HfCl_4$ can be stopped. The inert (e.g., $N_2$) purge gas can then be provided into the reaction chamber, where it is designed to displace any portion of the $HfCl_4$ that has not been adsorbed on the surface of the partially fabricated integrated circuit.

Once the deposition chamber is purged, the second reactant pulse can start with the $H_2O$ being introduced into the reaction chamber. Once in the reaction chamber, the $H_2O$ chemically reacts with the adsorbed —$HfCl_3$ species to form a monolayer of hafnium oxide $HfO_2$ or —$Hf(OH)_3$ on select surfaces of the partially integrated circuit. After the formation of the $HfO_2$, the flow of the $H_2O$ can be stopped. The $N_2$ purge gas can then be provided into the reaction chamber, where it is designed to displace any portion of the $H_2O$ that has not sufficiently been adsorbed on the surface of the partially fabricated integrated circuit. This process can be repeated to form multiple monolayers of $HfO_2$ on select surfaces of the partially fabricated integrated circuit. Due to steric hindrance and low hydroxyl group coverage at deposition temperature, average deposition rates are less than a full molecular monolayer per cycle in most ALD processes.

In contrast, those reactor surfaces and/or surfaces of the partially fabricated integrated circuit structure on which a mixed SAM was deposited will have a minimal amount (if any) of material deposition, such that the overall ALD process will be selective. The mixed SAM, which is formed by two precursors, includes hydrophobic tail-ends that block and prevent adsorption of the ALD precursors on underlying surfaces. Thus, ALD precursors, such as $HfCl_4$ will only adsorb on exposed surfaces that do not have an overlying mixed SAM. Examples of ALD precursors that will not react with the hydrophobic tails of SAMs include water, alcohols, and other molecules with —OH functionality, metal halides (e.g., $HFCl_4$, $ZrCl_4$, $TiCl_4$), organometallic precursors (e.g., TMA, TEMAH) and other —OH reactive organic and inorganic precursors. Thus, ALD precursors that are water reactive and which do not react with the SAM will be deactivated.

It will be apparent to those skilled in the art that various modifications and variations can be made in the present invention without departing from the scope or spirit of the invention. In some embodiments, many of the processing/cleaning cycles described above can omit certain steps or cycles, and still achieve benefits. For example, with respect to FIGS. 4A and 4B, it is possible to omit the step of adsorbing 420 short-chain molecules, and still achieve numerous benefits of the present invention. Even adsorbing a SAM layer that has only long-chain molecules can benefit from the in situ repair, combination of hydroxylation and in situ repair, and in situ and ex situ stripping processes described herein. Thus, it is intended that the present invention cover the modifications and variations of this invention provided that they come within the scope of the appended claims or their equivalents.

What is claimed:

1. A method of processing, comprising:

providing an exposed surface;

supplying a first organic precursor having a first molecular chain length to adsorb a self-assembled monolayer over the exposed surface; and supplying a second organic precursor having a second molecular chain length that is shorter than the first molecular chain length to adsorb onto reactive sites of the exposed surface on which a self-assembled monolayer is not adsorbed.

2. The method of claim 1, wherein the exposed surface is a surface of a reaction chamber.

3. The method of claim 1, wherein the exposed surface is a surface of a patterned substrate.

4. The method of claim 3, wherein the exposed surface is an insulating surface of an integrated circuit structure.

5. The method of claim 1, wherein the first molecular chain length is a length greater than or equal to 8 carbon atoms.

6. The method of claim 1, wherein the second molecular chain length is a length less than 8 carbon atoms.

7. The method of claim 1, wherein the first molecular chain length is a length greater than or equal to 12 carbon atoms and the second molecular chain length is a length less than or equal to 6 carbon atoms.

8. The method of claim 3, further comprising performing a selective ALD process on the patterned substrate in the reaction chamber, wherein a negligible amount of material is deposited on the self-assembled monolayer during the selective ALD process.

9. The method of claim 8, wherein the amount of material deposited on the self-assembled monolayer is less than 10% of that deposited on similar surfaces without the self-assembled monolayer.

10. The method of claim 8, wherein the self-assembled monolayer is formed on a first surface of the patterned substrate without forming the self-assembled monolayer on a second surface of the patterned substrate.

11. The method of claim 1, further comprising performing a hydroxylation process on the exposed surface prior to introducing the first organic precursor.

12. The method of claim 11, wherein the hydroxylation process comprises exposing the exposed surface to ozone gas.

13. The method of claim 11, further comprising repeating the hydroxylation process and introducing the first organic precursor and/or second organic precursor one or more times.

14. The method of claim 13, wherein repeating the hydroxylation process and introducing the first organic precursor and/or second organic precursor occurs once every 2-3 days as part of an in situ repair process.

15. The method of claim 13, further comprising periodically stripping the self-assembled monolayer and a first molecular chain length and a second molecular chain length adsorbed over the exposed substrate ex situ.

16. The method of claim 15, wherein periodically stripping ex situ is conducted with periods of at least fifteen weeks between from deposition runs.

17. The method of claim 15, wherein periodically stripping ex situ is conducted with periods of at least four weeks between from deposition runs involving ALD deposition of $HfO_2$.

18. The method of claim 1, wherein the first organic precursor and the second organic precursor are supplied simultaneously.

19. The method of claim 1, further comprising removing unreacted first organic precursor that is not adsorbed over the exposed surface prior to supplying the second organic precursor.

20. The method of claim 1, further comprising removing unreacted second organic precursor that is not adsorbed onto reactive sites.

21. The method of claim 1, further comprising extracting unadsorbed molecules from the exposed surface after supplying the first organic precursor and/or second organic precursor.

22. The method of claim 21, further comprising re-supplying the first organic precursor and/or the second organic precursor after extracting the unadsorbed molecules.

23. A method of processing with a vapor deposition reactor, comprising:

supplying a first organic precursor to deposit a self-assembled monolayer over portions of a reactor surface; and supplying a second organic precursor to react with portions of the reactor surface on which the self-assembled monolayer was not deposited, wherein the chain of molecules in the second organic precursor is shorter than the chain of molecules in the first organic precursor.

24. The method of claim 23, wherein the first organic precursor and the second organic precursor are introduced simultaneously.

25. The method of claim 23, further comprising performing an ALD process on an integrated circuit structure in the reactor, wherein one or more monolayers are deposited onto the integrated circuit structure and not on the self-assembled monolayer on the reactor surface.

26. The method of claim 23, wherein the first organic precursor is supplied in situ within the reactor.

27. The method of claim 23, wherein the first organic precursor is introduced ex situ outside the reactor.

28. The method of claim 23, further comprising removing reacted molecules of the first organic precursor and reacted molecules of the second organic precursor over portions of the reactor surface in situ using ozone, oxygen, $N_xO_y$, or other oxidizing plasma species after supplying the first organic precursor and second organic precursor.

29. A method of forming a semiconductor device, comprising:

providing an integrated circuit structure into a reaction chamber having a first surface and a second surface different from the first surface;

introducing a first organic precursor into the reaction chamber to coat portions of the first surface with a self-assembled monolayer without coating the second surface;

purging unreacted first organic precursor that does not coat the first surface from the reaction chamber;

introducing a second organic precursor into the reaction chamber to react with reactive sites of the first surface that are not coated with the first organic precursor; and purging unreacted second organic precursor that does not react with reactive sites from the reaction chamber.

30. The method of claim 29, further comprising performing a selective ALD process, wherein material is deposited on the second surface and not on the first surface coated with the self-assembled monolayer.

31. The method of claim 30, further comprising performing a thermal anneal to remove the self-assembled monolayer.

32. The method of claim 29, wherein the first organic precursor is selected from the group consisting of octadecyltrichlorosilane (ODTS), tridecafluororo-1,1,2,2-tetrahydrooctyltrichlorosilane (FOTS) and tetradecyltrichlorosilane (TTS).

33. The method of claim 32, wherein the second organic precursor is selected from the group consisting of trichloromethylsilane (TCMS), trimethylchlorosilane (TMCS) and FOMB(DMA)S.

34. An integrated film structure, comprising:

a first surface and a second adjacent surface different from the first exposed surface; and a mixed hydrophobic film adsorbed on the first surface without forming on the second surface, the film comprising a plurality of first chain organic molecules and a plurality of second chain organic molecules, the second chain organic molecules being shorter than the first chain organic molecules.

35. The integrated film structure of claim 34, wherein the first exposed surface comprises a dielectric material and the second exposed surface comprises a semiconductor material.

36. The integrated film structure of claim 34, wherein the mixed hydrophobic film has a water contact angle of greater than 100 degrees.

37. The integrated film structure of claim 34, further comprising an overlying atomic layer deposition (ALD) film deposited on the second exposed surface and negligibly over the mixed hydrophobic film on the first exposed surface.

38. The integrated film structure of claim 37, wherein the ALD film has a thickness of between 10 Å and 30 Å.

39. The integrated film structure of claim 37, wherein the ALD film has a thickness uniformity of greater than 98%.

40. The integrated film structure of claim 37, wherein the ALD film has a step coverage of greater than 98%.

* * * * *

UNITED STATES PATENT AND TRADEMARK OFFICE

CERTIFICATE OF CORRECTION

PATENT NO. : 8,293,658 B2
APPLICATION NO. : 12/707065
DATED : October 23, 2012
INVENTOR(S) : Shero et al.

It is certified that error appears in the above-identified patent and that said Letters Patent is hereby corrected as shown below:

On Sheet 3 of 13 of the Drawing, FIG. 3A, Reference No. 320, please change "SELF-ASSEMEBLED" to -- SELF-ASSEMBLED --.

In column 5, line 66-67, please change "tridecafluororo" to -- tridecafluoro --.

In column 6, line 10-11, please change "trimethylchlorosile" to -- trimethylchlorosilane --.

In column 16, line 2, please change "subtrate(s)" to -- substrate(s) --.

In column 18, line 32, please change "tridecafluororo" to -- tridecafluoro --.

In Claim 32, column 22, line 55, please change "tridecafluororo" to -- tridecafluoro --.

Signed and Sealed this
Second Day of April, 2013

Teresa Stanek Rea
*Acting Director of the United States Patent and Trademark Office*